(12) United States Patent
Roth et al.

(10) Patent No.: US 11,978,523 B1
(45) Date of Patent: May 7, 2024

(54) ERROR-DETECTION SCHEMES FOR ANALOG CONTENT-ADDRESSABLE MEMORIES

(71) Applicant: HEWLETT PACKARD ENTERPRISE DEVELOPMENT LP, Spring, TX (US)

(72) Inventors: Ron M. Roth, Palo Alto, CA (US); Catherine Graves, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 23 days.

(21) Appl. No.: 17/983,050

(22) Filed: Nov. 8, 2022

(51) Int. Cl.
  *G11C 29/10* (2006.01)
  *G11C 15/04* (2006.01)
  *G11C 27/00* (2006.01)

(52) U.S. Cl.
  CPC ............ *G11C 29/10* (2013.01); *G11C 15/046* (2013.01); *G11C 27/005* (2013.01)

(58) Field of Classification Search
  CPC ...... G11C 29/10; G11C 15/046; G11C 27/005
  See application file for complete search history.

(56) References Cited

U.S. PATENT DOCUMENTS

| | | | |
|---|---|---|---|
| 4,926,426 A | 5/1990 | Scheuneman et al. | |
| 5,148,385 A | 9/1992 | Frazier | |
| 5,293,612 A | 3/1994 | Shingai | |
| 6,279,133 B1 | 8/2001 | Vafai et al. | |
| 7,200,793 B1 | 4/2007 | Kengeri et al. | |
| 8,379,509 B2 | 2/2013 | Mackinnon et al. | |
| 8,887,026 B2 | 11/2014 | Bremler-Barr et al. | |
| 9,455,745 B2 | 9/2016 | Tantos | |
| 10,082,890 B2 | 9/2018 | Qiao et al. | |
| 10,984,863 B2 | 4/2021 | Sheikh et al. | |
| 2007/0088909 A1* | 4/2007 | Krishnan | G11C 15/04 711/108 |
| 2015/0109840 A1* | 4/2015 | Seong | G11C 16/102 365/49.1 |
| 2019/0349318 A1 | 11/2019 | Fok et al. | |

OTHER PUBLICATIONS

B. Lindstrom, "Determination of two vectors from the sum", J. Comb. Theory, 6, 1969, 402-407.

(Continued)

*Primary Examiner* — Thien Nguyen
(74) *Attorney, Agent, or Firm* — Sheppard Mullin Richter Hampton LLP

(57) ABSTRACT

Examples of the presently disclosed technology provide new circuits for detecting errors in aCAMs with improved efficiency. Specifically designed around the structure and operation of aCAM arrays, these circuits include counter sub-circuits electrically connected to match lines of aCAM rows such that the counter sub-circuits receive match-related signals output from aCAM rows. The value stored by a counter sub-circuit may change in response to receiving a match signal, and may remain the same in response to receiving a mismatch signal. As will be described in greater detail below, the stored value of the counter sub-circuit may be used to detect/identify an error in its associated aCAM row after a set of (specially-computed) error-detection input vectors are sequentially applied to the circuit.

20 Claims, 9 Drawing Sheets

(56) References Cited

OTHER PUBLICATIONS

B. Lindstr om, "On B2-sequences of vectors," J. Number Theory, 4 (1972), 261-265.
Babai et al., "Sidon Sets in Groups and Induced Subgraphs of Cayley Graphs", Europ. 1. Combinatorics, 1985, pp. 101-114.
Barr et al., "PEDS: A Parallel Error Detection Scheme for TCAM Devices", IEEE/ACM Trans, 2010, 14 Pages.
Berinde et al., "Combining Geometry and Combinatorics: a Unified Approach to Sparse Signal Recovery", Proc. 46th Annual Allerton Conf. on Communication, Control, and Computing, Monticello, Illinois, 2008, 14 pages.
Bhu Dev et al., "On m-my Gray Codes", Informa Tion Sciences 15, 1978, pp. 31-43.
Bshouty et al., "On Parity Check (0; 1)-Matrix over Zp", Electronic Colloquium on Computational Complexity, Report No. 67 (2009), 22 pages.
Bshouty et al., "Optimal Algorithms for the Coin Weighing Problem with a Spring Scale", Proc. 22nd Conf. on Learning Theory (COLT 2009), Montreal, Quebec, Jun. 2009, 10 pages.
Cheraghchi et al., "Simple Codes and Sparse Recovery with Fast Decoding", Jul. 2019, 21 pages.
Cohen et al., "Binary B2-Sequences : A New Upper Bound", Journal of Combinatorial Theory, Series A 94, 2001, 4 pages.
D'yachkov et al., "On a Coding Model for a Multiple-Access Adder Channel", vol. 17, Issue 2, 1981, 14 pages.
Egorova et al., "Signature codes for weighted noisy adder channel, multimedia fingerprinting and compressed sensing", Designs, Codes and Cryptograph, 2019, 8 pages.
Faddeev et al., "Problems in Higher Algebra, (translated from Russian)", Mir Publishers, 1968, 318 Pages.
Javier Cilleruelo, "Combinatorial Problems in Finite Fields and Sidon Sets", 2011, 14 pages.
Joel Brenner, "The Hadamard Maximum determinant problem", The American Mathematical Monthly, vol. 79, No. 6. (Jun.-Jul., 1972), pp. 626-630.
Li et al., "Analog content-addressable memories with memristors", Nature Communications, 2020, 8 pages.
M. Grassl, "Bounds on the minimum distance of linear codes and quantum codes," Available online at http://www.codetables.de (accessed on May 18, 2022, 1 pages.
O'Bryant et al., "A complete annotated bibliography of work related to Sidon sequences", Electron. J. Comb., Dynamic Survey No. 11, 2004, 39 pages.
OEIS, "The ON-Line Encyclopedia of Integer Sequences", available online at <https://oeis.org/A003432>, 1964, 3 pages.
Orlitsky et al., "Interactive Communication of Balanced Distributions and of Correlated Files", Society for Industrial and Applied Mathematics, vol. 6, No. 4, 1993, 17 pages.
Pedretti et al., "Tree-based machine learning performed in-memory with memristive analog CAM", Nature Communications, 2021, 10 pages.
Ron M. Roth, "Analog Error-Correcting Codes", IEEE, 2020, 14 pages.
Ron M. Roth, "Fault-Tolerant Dot-Product Engines", Aug. 23, 2017, 12 pages.
Wikipedia, "Chinese remainder theorem", available online at <https://en.wikipedia.org/wiki/Chinese_remainder_theorem>, Dec. 25, 2022, 16 pages.
Wikipedia, "Decoding methods", available online at <https://en.wikipedia.org/wiki/Decoding_methods#Syndrome_decoding>, Jan. 26, 2023, 5 pages.
Wikipedia, "Linear code", available online at <https://en.wikipedia.org/wiki/Linear_code>, Oct. 12, 2022, 6 pages.

* cited by examiner

TABLE 300

PARAMETERS OF CONSTRUCTION A FOR AN A-CAM with $k = 50$ TASK-DRIVEN COLUMNS.

| $\tau$ | $r$ | $n$ | $\|\|H\|\|$ | $\|X\|$ $q=8$ | $q=16$ |
|---|---|---|---|---|---|
| 1 | 1 | 51 | 51 | 357 | 765 |
| 2 | 6 | 56 | 156 | 1,092 | 2,340 |
| 3 | 7 | 57 | 187 | 1,309 | 2,805 |

FIG. 3

TABLE 400

PARAMETERS OF CONSTRUCTION B FOR AN A-CAM with $k = 50$ TASK-DRIVEN COLUMNS.

| $r$ | $n$ | $\|H^*\|$ | | $\|x^*\|$ | |
|---|---|---|---|---|---|
| | | $p = 11$ | $p = 17$ | $p = 11$ | $p = 17$ |
| 1 | 51 | 51 | 51 | 510 | 816 |
| 3 | 53 | 148 | 138 | 1,480 | 2,208 |
| 4 | 54 | 218 | 209 | 2,180 | 3,344 |

FIG. 4

TABLE 500

APPROXIMATE COLUMN REDUNDANCY AND NUMBER OF TEST VECTORS FOR CONSTRUCTIONS A AND B

| Scheme | Column redundancy | Number of test vectors |
|---|---|---|
| A. Bit interleaving | $\frac{1}{2} \cdot \tau \cdot \log_2 n$ | $\frac{1}{4} \cdot q \cdot \tau \cdot n \log_2 n$ |
| B. Shift and count | $\frac{q-1}{q} \cdot \tau \cdot \log_q n$ | $\frac{1}{2} \cdot q \cdot \tau \cdot n \log_q n$ |

FIG. 5

ERROR-DETECTION SCHEMES FOR ANALOG CONTENT-ADDRESSABLE MEMORIES

BACKGROUND

Content addressable memory ("CAM") is a type of computing memory in which stored data is searched by its content rather than its location. When a "word" is input to a CAM, the CAM searches for the word in its contents. If the CAM finds the word (i.e., "returns a match"), the CAM returns the address of the location where the found word resides.

Analog CAMs ("aCAMs") are special types of CAMs that can store and search for ranges of values (in contrast to more traditional digital-based CAMs which can only store/search for zeros and ones) using the programmable conductance of memristors.

Individual aCAM cells can be arranged into aCAM arrays consisting of rows and columns of aCAM cells. Words can be stored along the rows of the aCAM array (the rows of an aCAM array can be referred to as "match lines"), where each aCAM cell of a given row stores an entry of the stored word. When the aCAM array receives an input word (e.g., a series of analog voltage signals each representing an entry of the input word), the aCAM array can search for the input word, by entry, along the columns of the aCAM array (i.e., a first entry of the input word can be searched down a first column of the aCAM array, a second entry of the input word can be searched down a second column of the aCAM array, etc.). The aCAM array will "find" the input word in a given row if all the aCAM cells of the given row return a match for their respective entries of the input word.

BRIEF DESCRIPTION OF THE DRAWINGS

The present disclosure, in accordance with one or more various examples, is described in detail with reference to the following figures. The figures are provided for purposes of illustration only and merely depict examples.

FIG. 3 depicts an example table, in accordance with examples of the presently disclosed technology.

FIG. 4 depicts another example table, in accordance with examples of the presently disclosed technology.

FIG. 5 depicts another example table, in accordance with examples of the presently disclosed technology.

Figure 1:
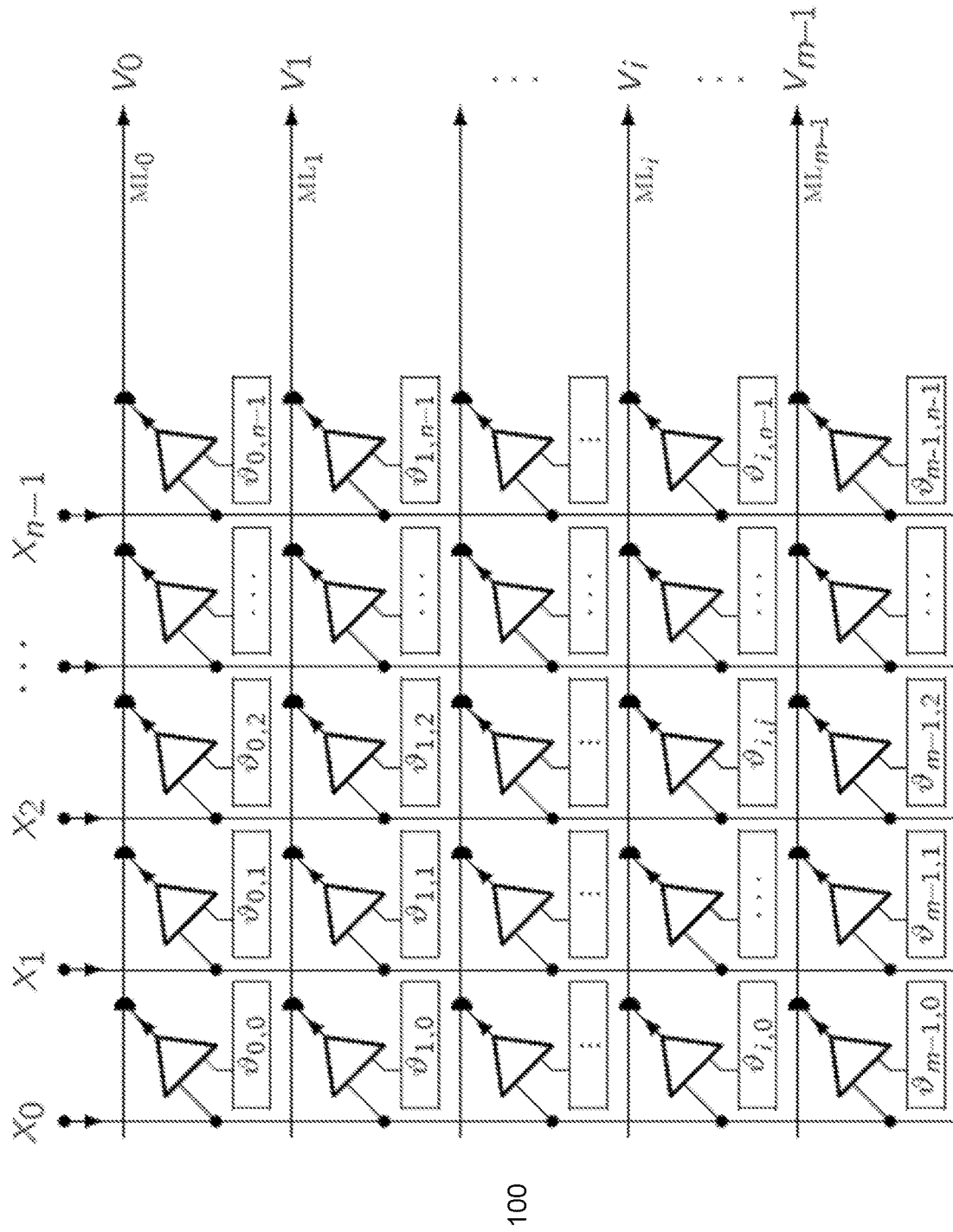
FIG. 1 depicts an example aCAM array, in accordance with examples of the presently disclosed technology.

The figures are not exhaustive and do not limit the present disclosure to the precise form disclosed.

DETAILED DESCRIPTION

Content addressable memories (CAMs) are powerful, efficient, and fast. However, conventional CAMs (i.e., digital/non-analog CAMs) are also relatively large, consume a lot of power, and are relatively expensive. These drawbacks historically limited the applicability of CAMs to select applications in which their power, efficiency, and speed are sufficiently desirable to outweigh their size, cost, and power consumption.

However, recent advancements involving analog CAMs (aCAMs) have realized significant reductions in size, cost and power consumption (as used herein, an aCAM may be considered a special type of CAM). Accordingly, aCAMs have recently been introduced as valuable accelerators for various computational tasks including matrix multiplication, machine-learning tasks such as tree-based inference, analog signal processing, scientific computing, etc.

While aCAMs are generally more powerful, efficient and fast than other non-CAM memories/memory processing circuits, they can be prone to errors from several sources including: (1) inaccurate programming of conductance values for memristors (e.g., the conductance value a memristor is actually programmed to may be different than intended); (2) drifts in stored conductance values over time (e.g., the conductance value a memristor was initially programmed to may drift over time such that the conductance value the memristor actually stores is different than the initially programmed value); (3) manufacturing defects (e.g., short cells or open cells); etc. When one or more aCAM cells of an aCAM row contains an error, the aCAM row may (a) erroneously return a match for an input word the aCAM row was not programmed/intended to store; or (b) erroneously return a mismatch for an input word the aCAM row was actually programmed/intended to store. These erroneous match line outputs can negatively impact performance for an aCAM array. For example the aCAM array may not be able to accurately/effectively perform a designated computational task. For this reason, the ability to detect errors in aCAM arrays can be very important.

However, there is currently a death of techniques for detecting errors in this nascent technology space (this is in part because techniques for detecting errors in other memory devices are not suitable for aCAMs due to differences in functionality). Relatedly, available (and unsophisticated) approaches for detecting errors in aCAM arrays are generally inefficient, and can consume significant computation resources. For example, while errors in an aCAM array can be detected by sequentially reading conductance values stored in the aCAM array's constituent cells using read circuitry of the aCAM array—this approach can require an enormous number of reads for larger aCAM arrays. For instance, in an aCAM array comprising 512 rows and 50 columns, detecting errors by sequentially reading conductance values using the read circuitry of the aCAM array would require 25,600 reads—which as alluded to would consume significant computation resources. Accordingly, there is a need for more efficient techniques for detecting errors in this nascent, and valuable technology space.

Against this backdrop, examples of the presently disclosed technology provide new circuits for detecting errors in aCAMs with improved efficiency. Specifically designed around the structure and operation of aCAM arrays, these circuits include counter sub-circuits (e.g., modulo-2 counter sub-circuits) electrically connected to match lines of aCAM rows such that the counter sub-circuits receive match-related signals output from aCAM rows (i.e. a given counter sub-circuit receives match-related signals output from an aCAM row electrically connected to the same match line as the given counter sub-circuit). The match-related signals output from an aCAM row may comprise a match signal when each aCAM cell of the aCAM row returns a match in response to an input vector being applied to the circuit and a mismatch signal when at least one of the aCAM cells of the aCAM row returns a mismatch in response to the input vector being applied to the circuit (such an input vector may comprise a plurality of analog voltage signals, each analog voltage signal applied down a different column of the aCAM array, or a digital signal/series of digital signals which are converted to analog voltage signals prior to application down the columns of the aCAM array). The value stored by a counter sub-circuit may change in response to receiving a match signal, and may remain the same in response to receiving a mismatch signal. As will be described in greater detail below, the stored value of the counter sub-circuit may be used to detect/identify an error in its associated aCAM row after a set of (specially-computed) error-detection input vectors are sequentially applied to the circuit.

In certain implementations, the circuit may also include "redundancy aCAM cells" programmed to store (specially-computed) redundancy values leveraged for error-detection purposes (as will be described below, in other implementations these redundancy values may instead be stored in a memory external to the aCAM array, and then may be imposed on the circuit through strategic initializing, and reinitializing of the values stored by the counter sub-circuits prior to and/or during application of error-detection input vectors). For instance, redundancy values can be programmed into an aCAM row by programming the conductance of memristors in one or more redundancy aCAM cells added to the aCAM row (these redundancy aCAM cells are electrically connected to a match line along with non-redundancy aCAM cells—and thus may be considered part of the aCAM row). Here, the non-redundancy aCAM cells (i.e., the "task-driven aCAM cells") of the aCAM row may be freely programmed as required by a computational task the aCAM array is being used to perform. As will be described in greater detail below, the redundancy values may be computed using a parity-check matrix (H) (as used herein a parity check matrix may refer to a matrix or similar representation that describes conditions that a codeword of a code must satisfy—the parity-check matrix (H) may be computed based on a number of columns in the aCAM array, and a maximum number of errors (i) to be detected per aCAM row). Using the parity-check matrix (H), the redundancy values may be computed such that each row of the aCAM array is programmed to "representationally" store at least one codeword of a code (C) (an aCAM cell effectively stores an analog voltage threshold—the value of this analog voltage threshold can be programmed by programming conductance of the aCAM cell's constituent memristor). Here, a codeword may be (representationally) programmed across all the aCAM cells of an aCAM row, or across a subset of aCAM cells of the aCAM row. The code (C) may relate to the number of programmable levels of the aCAM cells of the aCAM array (as will be described in greater detail below, the number of programmable levels for an aCAM cell may be proportional to the number of unique/discrete conductance values the aCAM cell's constituent memristor can be reliably programmed to). In certain implementations (e.g., the internal redundancy implementation for the "bit-interleaving" scheme described below), computing the redundancy values such that each row of the aCAM array is programmed to (representationally) store at least one codeword of the code (C) may correspond to computing redundancy values such that each row of a binary array representing the word (representationally) programmed across a given aCAM row in binary digits (i.e., ones and zeros) includes a sequence of ones and zeros prescribed by the parity-check matrix (H). These sequences—which are imposed on the given aCAM row by programming redundancy analog voltage thresholds in redundancy aCAM cells of the given aCAM row—ensure that each row in the binary array representing the word (representationally programmed across the given aCAM row) in binary digits includes at least one codeword of the code (C) relating to the binary parity-check matrix (H).

As alluded to above, leveraging imposed redundancy values (e.g., imposed via "internal redundancy" where redundancy aCAM cells are added to aCAM arrays, or via "external redundancy" where redundancy values are stored in an external memory and are imposed on the circuits through strategic initializing/reinitializing of the stored values of the counter sub-circuits), circuits of the presently disclosed technology detect errors in an aCAM row based on the stored value of a counter sub-circuit associated with the aCAM row after a set of (specially-computed) error-detection input vectors have been sequentially applied to the circuit. Like the redundancy values described above, the set of error-detection input vectors may be computed based on the parity-check matrix (H). In certain implementations (e.g., internal redundancy implementations for the bit-interleaving scheme), a circuit detects an error in the aCAM row when: (a) if the binary parity matrix (H) prescribes even parity, the value stored by a counter sub-circuit (electrically connected to the match line of the aCAM row) after sequential application of the set of error-detection input vectors is different than the value stored by the counter sub-circuit before sequential application of the set of error-detection input vectors (as alluded to above, this may correspond to the counter sub-circuit receiving an even number of match signals); and (b) if the binary parity matrix (H) prescribes odd parity, the value stored by the counter sub-circuit after sequential application of the set of error-detection input vectors is the same as the value of the counter sub-circuit before sequential application of the set of error-detection input vectors (as alluded to above, this may correspond to the counter sub-circuit receiving an odd number of match signals).

Referring again to the error-detection input vectors, each error-detection input vector may comprise a plurality of analog voltage input signals, each analog voltage input signal being applied down one of the columns of the aCAM array (when initially received by the circuit an error-detection input vector may comprise a digital input signal/plurality of digital input signals which are converted by the circuit into the plurality of analog voltage signals before application down the aCAM columns). Each error-detection input vector may only include one "non-wildcard" analog voltage input signal, a "wildcard" analog voltage input signal computed such that any aCAM cell of the aCAM array always returns a match when the wildcard analog voltage input signal is applied to it (by this construction, each error-detection input vector effectively checks one column of the aCAM array). In part through their relation to the parity-check matrix (H)— which itself is computed based on the number of columns of the aCAM array and a maximum number of errors (i) to be detected per aCAM row—the set of error-detection input vectors may be computed based on: (a) a number of columns of the aCAM array, wherein a number of error detection vectors in a set of error detection vectors is an integer multiple of the number of columns in the aCAM array; (b) a number of programmable levels that each aCAM cell of the aCAM array can be programmed to store; and (c) a maximum number of errors (i) to be detected across a single row of aCAM cells.

As alluded to above, circuits of the presently disclosed technology can detect errors in aCAM arrays more efficiently than existing/conventional techniques. For instance, and as described above, detecting errors by sequentially reading conductance values using the read circuitry of a 512×50 aCAM array (i.e., an aCAM array with 512 rows and 50 columns) would require 25,600 reads. By contrast, circuits of the presently disclosed technology can detect up to one error per row of the 512×50 aCAM array with just 357 reads (i.e., application of 357 error-detection input vectors spread across a plurality of sets of error-detection input vectors) where the aCAM cells each have 8 programmable levels, or 765 reads (i.e., application of 765 error-detection input vectors spread across a plurality of sets of error-detection input vectors) where the aCAM cells each have 16 programmable levels (in "internal redundancy" implementations such a circuit may include the addition of one redundancy column to the aCAM array). Similarly, circuits of the presently disclosed technology can detect up to 3 errors per row of the 512×50 aCAM array with just 1,309 reads (i.e., application of 1,309 error-detection input vectors spread across a plurality of sets of error-detection input vectors) where the aCAM cells each have 8 programmable levels, or 2,805 reads (i.e., application of 2,805 error-detection input vectors spread across a plurality of sets of error-detection input vectors) where the aCAM cells each have 16 programmable levels (in "internal redundancy" implementations such a circuit may include the addition of 3 redundancy columns to the aCAM array). As demonstrated by either of these exemplary comparisons, circuits of the presently disclosed technology can detect errors in aCAM arrays significantly more efficiently than existing/conventional techniques. This improved efficiency can reduce time, power consumption, computation resources, cost, etc., associated with detecting errors in aCAM arrays.

It should also be understood how circuits of the presently disclosed technology leverage the unique construction/operation of aCAM circuits in their error-detection schemes. In particular, example circuits leverage the parallel operation of aCAM arrays (i.e., the fact that a given error-detection input vector can be applied to all aCAM rows of an aCAM array concurrently—and that by extension, each aCAM row of the aCAM row produces its match line output concurrently) such that the time complexity of an error-detection cycle will not depend on the number of rows of the aCAM. Accordingly, examples can greatly reduce the time complexity associated with detecting errors in very large aCAM arrays with e.g., thousands of aCAM rows.

Before describing examples of the presently disclosed technology in greater detail, a brief introduction of (1) certain notation used in subsequent descriptions; and (2) basic operation of aCAMs—may be instructive.

For integers a≤b, where [a:b] denotes the integer subset {z∈ ℤ: a≤z≤b} and [a:b⟩ denotes the set [a:b−1]; this document will utilize the shorthand notation [b] and [b⟩ for [1:b] and [0:b⟩, respectively.

q≥2 may be a positive integer which stands for the alphabet size (as alluded to above, q may also/relatedly represent the number of programmable levels of each aCAM cell of an aCAM array). Here, a q-comparator (e.g., an aCAM cell of the presently disclosed technology) may be a circuit that implements the bivariate function $\Gamma_q:[q]^2 \to \{0,1\}$ which is defined by equation (1) below.

$$\Gamma(x, \vartheta) = \Gamma_q(x, \vartheta) = \begin{cases} 1 & \text{if } x \leq \vartheta \\ 0 & \text{otherwise} \end{cases} \quad (1)$$

The argument x may represent an input signal applied to the q-comparator (e.g., an individual signal component of an input signal) and may represent the threshold stored (or representationally stored) by the q-comparator (i.e., here a q-comparator is synonymous with an aCAM cell of the presently disclosed technology).

As alluded to above, recent designs of nanoscale aCAMs use q-comparator blocks arranged in m×n arrays (i.e., aCAM arrays with m rows n columns) with each entry $(i, j) \in [m] \times [n]$ implementing the function $x \mapsto \Gamma_q(x, \vartheta_{i,j})$, for some threshold $\vartheta_{i,j}$. An input vector (e.g., an error-detection input vector) applied to the aCAM array may be represented as a vector $x = (x_j)_{j \in [n]} \in [q]^n$, with $x_j$ serving as the input to all the comparators along column j. Each row ("match line") in the aCAM array computes the conjunction ("and", "∧") of the outputs of the comparators along the row, and the m results from the output vector, $v \in \{0,1\}^m$, of the aCAM array. The nonzero entries in v are referred to as "matches," and in practice one might be interested in finding all the matches (i.e., knowing the whole vector v), or only in whether there is at least one match, or only in the number of matches. Each aCAM cell $(i, j)$ may contain a memristor whose conductance is set/programmed, to (a value which is proportional to) the threshold $\vartheta_{i,j}$. These conductances are assumed to change much less frequently than the input vector x.

FIG. 1 presents a conceptual schematic diagram of an aCAM array 100. aCAM array 100 consists of an m×n array of aCAM cells. Each aCAM cell functions as a comparator (represented by the triangular shape). Each comparator has two q-ary input terminals and one output binary terminal. For a given comparator/aCAM cell, one input terminal is associated with a threshold analog voltage stored by the aCAM cell and is fed by the memristor of the aCAM cell (here the memristor of the aCAM cell stores a conductance value proportional to the analog voltage threshold stored by the aCAM cell). The second input terminal of the comparator is connected through a column conductor to an entry of the input vector x (i.e., it is connected to in an input analog voltage signal). The output terminals of the n comparators along each row $i \in [m]$ are "AND"ed together to produce the match line value, $ML_i$. Under normal operation of aCAM array 100, the output value $v_i$ of row i equals $ML_i$.

As alluded to above, the operation of an aCAM (e.g., aCAM array 100) can be prone to errors from several sources including: (1) inaccurate programming of conductance values for memristors (e.g., the conductance value a memristor is actually programmed to may be different than intended); (2) drifts in stored conductance values over time (e.g., the conductance value a memristor was initially programmed to may drift over time such that the conductance value the memristor actually stores is different than the initially programmed value); (3) manufacturing defects (e.g., short cells or open cells); etc. When one or more aCAM cells of an aCAM row contains an error, the aCAM row may (a) erroneously return a match for an input word the aCAM row was not programmed/intended to store; or (b) erroneously return a mismatch for an input word the aCAM row was actually programmed/intended to store. These erroneous match line outputs can negatively impact performance for an aCAM array. For example, the aCAM array may not be able to accurately/effectively perform a designated computational task. For this reason, the ability to detect errors in an aCAM array can be very important. As available/less sophisticated error-detection techniques for aCAMs generally lack efficiency, examples of the presently disclosed technology fill an important need for efficient error detection in this nascent, and valuable technology space.

As alluded to above, examples of the presently disclosed technology provide several schemes (and circuits for implementing the schemes) for detecting errors in aCAM arrays. These schemes generally involve: (1) circuit hardware additions (e.g., counter sub-circuits, redundancy aCAM cells for internal redundancy schemes, etc.); (2) redundancy encoding (which in certain examples may be performed during programming of the non-redundancy/task-driven aCAM cells of the aCAM array); and (3) error detection (which may be performed periodically) that consists of applying one or more sets of specially-computed error-detection input vectors to the aCAM array—where an error in a given aCAM row of the aCAM array can be detected after application of the final error-detection input vector of a set. For example; (1) after application of the final error-detection input vector of a first set of error-detection input vectors a presently disclosed circuit may detect an error in a first aCAM row; (2) after application of the final error-detection input vector of a second set of error-detection input vectors the presently disclosed circuit may detect an error in a second aCAM row; (3) after application of the final error-detection input vector of a third set of error-detection input vectors the presently disclosed circuit may detect an error in a third aCAM row; and so on.

As alluded to above, for the presently disclosed schemes to work, redundancy values are imposed on an aCAM array in addition to the aCAM array's task-driven thresholds (i.e., the thresholds of the aCAM array programmed according to the aCAM array's designated computational task). These computed redundancy values can be stored in one of two ways: (1) through "internal redundancy"—where computed redundancy values are programmed as thresholds in redundancy columns of the aCAM array (as alluded to above, this may comprise programming conductances of memristors of redundancy aCAM cells such that the redundancy aCAM cells effectively store a threshold analog voltage value that represents a computed redundancy value); and (2) "external redundancy"—where the computed redundancy values are stored a memory (e.g., an SRAM) external to the aCAM array—and the redundancy values are imposed on the aCAM array through initialization (and in certain cases strategic re-initialization) of the values stored in the counter sub-circuits described above.

During error-detection (i.e., application of error-detection input vectors to the aCAM array), aCAM rows that contain errors (i.e., aCAM rows that return erroneous/non-intended match-related signals) can be detected/identified based on values stored by the counter sub-circuits described above. Each disclosed scheme may differ in the trade-offs that they offer between the following range of attributes: (a) amount of changes and additions to circuit hardware; (b) number of redundancy columns, and (c) time complexity (or latency) of the detection cycle.

As alluded to above, these schemes generally take advantage of the parallel operation of aCAMs in that all aCAM rows of an aCAM array are fed with the error-detection input vectors, and produce their respective match line outputs, concurrently. Accordingly, the time complexity of the detection cycle in these schemes may not depend on the number of aCAM rows in the aCAM array.

Here, it can be convenient to regard the threshold values $\vartheta_{i,j}$ as elements in the ring, $\mathbb{Z}_q$, of integers modulo q. An aCAM array (e.g., aCAM array 100) can then be viewed as an m×n array over $\mathbb{Z}_q$, with $\vartheta_i = (\vartheta_{i,j})_{j \in [n]}$ representing the vector of thresholds along $i \in [m]$. As alluded to above, encoding can generally be carried out so that each $\vartheta_i$ forms a codeword of some code (subset) $C$ of $\mathbb{Z}_q^n$. For a prescribed k (which depends on the code $C$), the first k entries in $\vartheta_i$ may contain the task-driven threshold values, which may be selected freely (during a programming phase) according to a desired computational task for the aCAM array. The remaining r=n−k entries may form the redundancy portion of the aCAM array (i.e., the redundancy columns that store, or representationally store, computed redundancy values as thresholds) and may be determined by an encoder for $C$ (again, during the programming phase). Here examples may seek to minimize r subject to the prescribed number of errors desired to be detected per aCAM row.

In reference to errors so far, this document has (implicitly) assumed the Hamming metric, where an error event means that a threshold value is incorrect, irrespective of the (integer) difference between the correct and erroneous values. The Hamming metric can be conservative as it can model a variety of sources of errors, such as malfunctioning of a comparator or drifts in the programmed threshold values. If only drift errors are expected, then there can be merit in considering an $L_1$-metric instead, thereby ending up with detection schemes that require less redundancy. Under an $L_1$-metric, an error event may be defined as changing a threshold value by ±1 (larger changes are interpreted as having multiple errors at the same threshold).

The subsequent description of examples of the presently disclosed technology is organized as follows. Sections I will summarize definitions and properties relating to codes. Section II will describe "internal redundancy" implementations for two detection schemes for the Hamming metric: the bit-interleaving scheme (Construction A in Section II-A) and the shift-and-count scheme (Construction B in Section II-B). The "external redundancy" implementations for these two schemes will be described in Section II-C. Section III will describe example circuits constructed in accordance with Sections I-II.

In all the presently disclosed detection schemes, the number of test vectors grows linearly with the alphabet size q and super-linearly with the number of columns of an aCAM array, yet does not depend on the number of rows of the aCAM array. As alluded to above, this feature allows examples of the presently disclosed technology to reduce time complexity for detecting errors in large aCAM arrays with many rows.

I. Definitions and Notation

Examples may utilize codes $C \subseteq \mathbb{Z}_q^n$ that are linear and systematic over $\mathbb{Z}_q$. Namely, there exists a k×n matrix G over $\mathbb{Z}_q$, referred to as the generator matrix, such that:
 (the linear property)

$$C = \{c = uG : u \in \mathbb{Z}_q^k\}$$

with operations carried out in $\mathbb{Z}_q$, and -
 (the systematic property) G contains an invertible k×k submatrix over $\mathbb{Z}_q$ In such a code, the rows of G form a basis of C, namely, they are linearly independent over $\mathbb{Z}_q$ and each codeword in C can be represented as a (unique) linear combination of the rows of G; thus, $|C| = q^k$. The parameters n, k, and r=n−k are called the length, dimension, and redundancy of C, respectively. By permuting the columns of G and applying invertible linear operations on the rows of G, examples can obtain a generator matrix of the form:

$$(I_k | A), \quad (2)$$

where $I_k$ is the k×k identity matrix. Encoding in this case can be carried out by the mapping:

$$u \mapsto uG = (u | uA), \quad (3)$$

where, u forms part of a codeword. It is for this reason that examples may require the systematic condition (on top of linearity, which will be useful for the detection process as well). To exploit the full functionality of the aCAM, the encoding scheme may not impose any constraints on the first, e.g., k task-driven threshold values in each aCAM row. It can be noted that when q is a prime, linearity always implies the systematic property.

The minimum (Hamming) distance of C, denoted usually by d, is the smallest number of positions on which any two distinct codewords differ. Equivalently, d is the smallest Hamming weight of any nonzero codeword in C. If a codeword is subject to any pattern of no more than $\tau = d-1$ errors, then such an event can always be detected (since the errors cannot change one codeword to another). Also, if a codeword is subject to any pattern of no more than $\lfloor (d-1)/2 \rfloor$ errors, then the codeword can always be recovered. The length n, dimension k, and minimum distance d of a systematic linear code will usually be written as a triple [n,k,d].

A parity-check matrix of a code $C \subseteq \mathbb{Z}_q^n$ is an r×n matrix over $\mathbb{Z}_q$ such that C forms its right kernel:

$$C = \{c \in \mathbb{Z}_q^n : Hc^T = 0_r\}$$

(where $0_r$ stands for the all-zero column in $\mathbb{Z}_q^r$ and the superscript T means transposition of a vector or matrix). Every systematic linear [n, k=n−r, d] code has an r×n parity-check matrix that contains an invertible r×r sub-matrix; in particular, when G has the form (2), then $$(-A^T | I_r)$$

is such a matrix. Conversely, any r×n matrix over $\mathbb{Z}_q$ which contains an invertible r×r sub-matrix is a parity-check matrix of a systematic linear [n, k=n−r, d] code over $\mathbb{Z}_q$. The minimum distance of such a code can be characterized through any of its parity-check matrices H as follows: it is the largest integer d such that every d−1 columns in H are linearly independent over $\mathbb{Z}_q$.

Given a row vector $y \in \mathbb{Z}^n$, the syndrome vector of y with respect to an r×n parity-check matrix H of a code $C \subseteq \mathbb{Z}_q^n$ is the column r-vector $$\sigma = Hy^T.$$

Thus, the codewords of C are all the vectors in $\mathbb{Z}_q^n$ whose syndrome is all-zero.

The notion of systematic linear codes extends in a straightforward manner to codes over the integer ring $\mathbb{Z}$ (except that in this case the code will have infinite size). In fact, every linear code over $\mathbb{Z}$ is also systematic (similarly to what was said for prime q).

II. Coding and Detection Schemes

This section presents two error-detection coding schemes for aCAM arrays, under the Hamming metric. Throughout this section, m and n stand for the number of rows and columns in the array, respectively, and r is the largest number of errors that can be detected in a given row. Each scheme uses a certain systematic linear [n, k=n−r,d=τ+1] code C. In Construction A (Section II-A) the code is binary, while in Construction B (Section II-B) the code is over $\mathbb{Z}_q$. In each coding scheme, the encoding algorithm may be identical for all rows and can be carried out by an encoder of the form of equality (3). In addition, examples can exploit the nature of operation of the aCAM in that the detection process will apply the same set of (specially-computed) error-detection input vectors—in parallel—to all aCAM rows (in particular, the latency of the process will not depend on the number of aCAM rows). This section will first describe the schemes utilizing the internal-redundancy implementation, where r (out of n) columns in an aCAM array are set aside for storing the redundancy values as thresholds (as alluded to above, these redundancy values may be programmed/stored by programming conductance of memristors in redundancy aCAM cells). Here r may be referred to as the column redundancy of an aCAM array. The external-redundancy implementation will be discussed in Section III-C.

As both the encoding and detection processes may be uniform across aCAM rows, this document uses the notation $\vartheta = (\vartheta_j)_{j \in [n]}$ to stand for the vector of thresholds along a generic aCAM row in the aCAM array, omitting the index $i$ of the aCAM row.

A. Construction A: Bit-Interleaving Scheme

The coding scheme to be presented in this section—referred to as the bit interleaving scheme or Construction A—applies to cases where the alphabet size q is a power of 2. Assuming that r is much smaller than n, $\mathcal{C}$ can be an [n, k=n−r, d=τ+1] binary alternant code (in particular, a BCH code) whose redundancy is given by equation (4) below:

$$r(\tau, n) = \begin{cases} \dfrac{\tau}{2} \cdot \lceil \log_2(n+1) \rceil & \text{if } \tau \text{ is even} \\ \dfrac{\tau-1}{2} \cdot \lceil \log_2 n \rceil + 1 & \text{if } \tau \text{ is odd} \end{cases} \quad (4)$$

Writing $b = \log_2 q$ (which is a positive integer), the row vector $\vartheta$ can be represented as a b×n binary array (i.e., a binary array representing the vector $\vartheta$ in binary digits)

$$\Phi = \Phi(\vartheta) = (\phi_{s,j})_{(s,j) \in [b] \times [n]}, \quad (5)$$

with column j in $\Phi$ being the b-vector in $\{0,1\}^b$ representing (the integer) $\vartheta_j$ to base 2:

$$\vartheta_j = \sum_{s \in [b]} 2^s \cdot \phi_{s,j}, \quad j \in [n]. \quad (6)$$

Encoding may be carried out so that for each $s \in [b]$, row s in $\Phi$, namely, $\phi_s = (\phi_{s,j})_{j \in [n]}$, is a codeword of C (hence the name bit interleaving). Thus, for $r = r(\tau, n)$ as in (4), the first k=n−r entries in $\vartheta$ may be freely selected (according to the computation task). The remaining r entries may be determined through encoding/computing of redundancy values. In other words (and as will be described in greater detail below), examples can determine a sequence of ones and zeros for each row s in $\Phi$ such that each s in $\Phi$ is a codeword of C. Examples can effectuate this sequence through encoding/computing redundancy values to be stored (or representationally stored) in redundancy aCAM cells of an aCAM array.

An underlying principle of the detection process is as follows: given an r×n binary parity-check matrix H=

$(H_{l,j})_{(l,j)\in[r]\times[n]}$ of C, error detection will be achieved through testing that the following equality holds for every $s\in[b)$:

$$H\phi_s s_s^T = 0 \quad (7)$$

(where the equality is over $\mathbb{Z}_2$). To this end, example circuits constructed in accordance with the bit-interleaving scheme add a modulo-2 counter sub-circuit (i.e., a toggle bit) to each match line of an aCAM array (i.e., the modulo-2 counter sub-circuit may be electrically connected to a match line of an aCAM row such that the modulo-2 counter receives match-related signals output from the aCAM row). The modulo-2 counter sub-circuit may be synchronized with the clock of the input n-vectors to the aCAM and may flip its value each time its input is a 1 (e.g., each time it receives a match signal output the aCAM row it shares a match line with).

Figure 2:
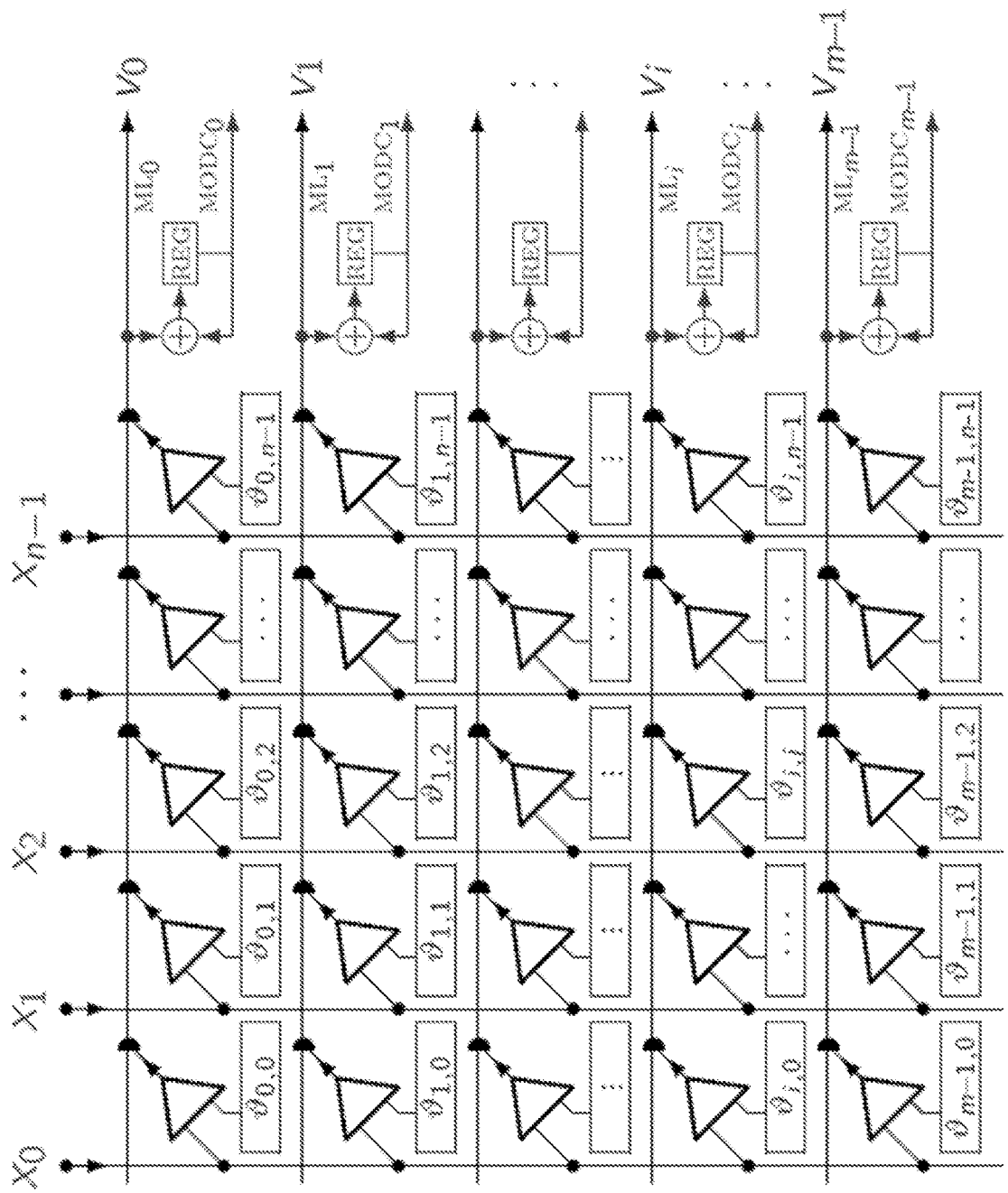
FIG. 2 depicts an example circuit, in accordance with examples of the presently disclosed technology.

FIG. 2 depicts an example aCAM array 200 with the addition of counter sub-circuits (these counter sub-circuits may be modulo-2 counter sub-circuits or other types of counter sub-circuits). In certain examples the "REG" therein may stand for a one-bit memory and the circled "+" may stand for addition modulo 2. In other words, each modulo-2 counter sub-circuit may have one input bit and one output bit, and may include a single-bit memory element (REG). During each clock cycle, the contents of REG can be updated by exclusive-OR-ing (XORing) its contents with the input. The output may be the contents of REG (here XORing is equivalent to addition modulo 2).

As alluded to above, during a detection cycle, a set $X\subseteq[q)^n$ of error-detection input vectors may be applied to aCAM array 200. This set of error-detection input vectors will be described in greater detail below after introducing some notation.

For $j\in[n)$ let $e_j$ be the standard unit vector that contains its (only) "one" at position j and for each $l\in[r)$, denote by $J_l$ the support of row l in H:

$$J_l = \{j\in[n):H_{l,j}\neq 0\}$$

Also, for $(l,s)\in[r)\times[b)$, let $X_{l,s}$ be the following subset of $[q)^n$:

$$X_{l,s}=\{(2a+1)\cdot 2^s\cdot e_j: a\in[2^{b-s-1}), j\in J_l\}$$

(which is of size $2^{b-s-1}\cdot|J_l|$). The set X is now defined as the union:

$$X = \bigcup_{(\ell,s)\in[r)\times[b)} X_{\ell,s}.$$

Thus:

$$|X| = \left(\sum_{s\in[b)} 2^{b-s-1}\right) \cdot \sum_{\ell\in[r)} |J_\ell| = (q-1)\cdot\|H\|, \quad (8)$$

where $\|H\|$ denotes the total number of one's in the matrix H. This number is at most $r\cdot n$, and for $r>1$ it is typically close to $r\cdot n/2$.

Algorithm (9) below presents a detection cycle, in which the elements of X are applied as error-detection input vectors to aCAM array 200.

for each $i\in[m)$ do $MODC_i\leftarrow 0;$ for each $l\in[r)$ do for $s\leftarrow b-1, b-2, \ldots, 0$ do for each $x\in X_{l,s}$ do apply x to the a-CAM;

for each $i\in[m)$ do $MODC_i\leftarrow(MODC_i+ML_i)\bmod 2;$ for each $i\in[m)$ do if $MODC_i\neq 0$ then flag error in row i.     (9)

As depicted, $ML_i$ and $MODC_i$ stand for the (binary) contents of the match line and the modulo-2 counter sub-circuit, respectively, of row i. In each iteration over (l,s), the error-detection input vectors in $X_{l,s}$ compute entry l in the vector $H\phi_s^T$ (see equality (7)). If the vector $H\phi_s^T$ is nonzero at some aCAM row, an error may be flagged at that aCAM row (referring to FIG. 2, during the detection cycle, examples may switch the output $v_i$ of row i to be $MODC_i$ instead of $ML_i$). It may be observed that $MODC_i=0$ is an invariant at the beginning of each iteration of the loop over s and, therefore, the value of $MODC_i$ at the end of each such iteration is the same as if $X_{l,s}$ were taken to be the larger set $$\{\alpha\cdot 2^s\cdot e_j:\alpha\in[1:2^{b-s}), j\in J_l\}$$

(in other words, for a given (l,s), algorithm (9) reuses computation made earlier for (l,s'>s)).

In summary, a detection process in accordance with examples of the presently disclosed technology may consist of applying at most $(q-1)\cdot r\cdot n$ test vectors to aCAM array 200 (and typically half that number). The required column redundancy is determined by equation (4).

Example 1: As an illustrative example, an aCAM array with m=512 rows and k=50 columns may be susceptible to errors. As alluded to above, an existing/conventional approach for detecting errors would involve periodically reading thresholds in the entire aCAM array directly— which would entail $m\cdot k=25,600$ reads. In comparison, Table 300 of FIG. 3 presents the column redundancy r and the error-detection input vectors utilized in Construction A, for q=8, 16 and $\tau=1, 2, 3$. As described above, equation (8) may be used to compute the error-detection input vectors $|X|$ (which as alluded to above may comprise multiple sets of error-detection input vectors). For $\tau=1$, matrix H is the $1\times 51$ all-one vector (1 1 ... 1). For $\tau=2$ it is a $6\times 56$ parity-check matrix of a shortened binary Hamming code, with the columns ranging over the lightest (in terms of Hamming weight) nonzero binary 6-vectors. And for $\tau=3$ it is a $7\times 57$ parity-check matrix of a shortened extended binary Hamming code, with the columns ranging over the lightest binary 7-vectors with odd Hamming weight.

Construction A can be generalized by changing the radix 2 therein to any radix $\rho\geq 2$ with $q=\rho^b$ for some positive integer b. Respectively, the counter sub-circuit in each aCAM row will now be modulo $\rho$ and the code C will be over $\mathbb{Z}_\rho$. In this example, C will have a 0-1 parity-check matrix, namely, a matrix whose entries are constrained to the subset $\{0,1\}$ of $\mathbb{Z}_q$. Otherwise, an implementation of the check of the equality (7) will require a different (and potentially much larger) set X of test vectors.

In this more general setting, the sets $X_{l,s}$ may be defined by:

$$X_{l,s}=\{\alpha\cdot\rho^s\cdot e_j:\alpha\in[1:\rho^{b-s}), \rho\nmid\alpha, j\in J_l\}, \quad (10)$$

B. Construction B: Shift-and-Count Scheme

The construction presented in this section—referred to as the shift-and-count scheme or Construction B—may have a smaller column redundancy than Construction A, at the price of using more complex counter sub-circuits electrically connected to the match lines of aCAM rows. Construction B may require that q be a prime, namely, that $\mathbb{Z}_q$ is the finite field GF(q) (as alluded to above, q represents the alphabet size of the code, and relatedly, the number of programmable levels of the aCAM cells of an aCAM array). To make clear that q is prime in Construction B, this section will use the notation p instead of q. In contrast to Construction A, which involved using a base-2 representation (i.e., a binary array) to represent the threshold vector $\vartheta$, Construction B utilizes the base-2 representation of the entries of the parity-check matrix of the underlying code that defines the scheme. The threshold vectors will be codewords of C.

Let C be a linear [n, k=n−r, d=τ+1] code over $\mathbb{Z}_p$ and let $H=(H_{l,j})_{(l,j)\in [r]\times[n]}$ be an r×n parity-check matrix of C over $\mathbb{Z}_p$. Write $b=\lceil \log_2 p \rceil$ and, for $l\in[r)$, let $b_l$ be the smallest positive integers such that $H_{l,j}\in[2^{b_l})$ (for this purpose, examples regard the entries $H_{l,j}$ as if they were integers in $[p)$). Thus, $b_l \leq b$ for all $l\in[r)$. For each $(l,j)\in[r)\times[n)$, let $h_{l,j}=(h_{s,l,j})_{s\in[b_l)}\in\{0,1\}^{b_l}$ be the base-2 representation of (the integer) $H_{l,j}$:

$$H_{\ell,j} = \sum_{s\in[b_\ell)} 2^s \cdot h_{s,\ell,j} \quad (11)$$

Then, for any $\vartheta = (\vartheta_j)_{j\in[n)} \in \mathbb{Z}_p^n$:

$$H\vartheta^T = 0$$

(over $\mathbb{Z}_p$), if and only if the following equality holds for every $l\in[r)$ $$\sum_{s\in[b_\ell)} 2^s \sum_{j\in[n)} h_{\ell,s,j} \cdot \vartheta_j = 0 \quad (12)$$

(over $\mathbb{Z}_p$). The shift-and-count scheme involve computing redundancy values such that equality (11) holds, and a detection cycle, which verifies equality (12) by applying to an aCAM array (as before) a set of error-detection input vectors $X^*\subseteq[p)^n$. As alluded to above, detection may require counter sub-circuits of modulo p (as opposed to modulo-2 counter subcircuits) which can also multiply by 2 (modulo p).

This section will now describe the set X*. To this end, it can be convenient to define an r*×n 0-1 matrix H* which is obtained from H by replacing each entry, $H_{l,j}$, by the column $b_l$-vector $h_{l,j}\in\{0,1\}^{b_l}$. Specifically, H* has $r^*=\Sigma_{l\in[r)} b_l$ rows, which are indexed by pairs (l,s) where $l\in[r)$ and $s\in[b_l)$, and n columns which are indexed by $j\in[n)$, and $(H^*)_{(l,s),j}=(h_{l,s,j})$. Denoting by $J_{l,s}^*$ the support of row (l,s) in H*, the set X* may be defined as the union:

$$X^* = \bigcup_{\ell\in[r)}\bigcup_{s\in[b_\ell)} X_{\ell,s}^*.$$

where, for each $l\in[r)$ and $s\in[b_l)$, $$X_{l,s}^* = \{a\cdot e_j : a\in[q), j\in J_{l,s}^*\}$$

Thus, $$|X^*| = (q-1)\cdot \sum_{\ell\in[r)}\sum_{s\in[b_\ell)} |J_{\ell,s}^*| = (q-1)\cdot \|H^*\|. \quad (13)$$

Algorithm (14) below presents the detection cycle, which verifies the equality (12) for every $l\in[r)$ and $s\in[b_l)$. The notation $MODSC_i$ stands for the stored value of a counter sub-circuit which can also multiply by 2 modulo p. (Note that the loop over s can be made uniform over all $l\in[r)$ by replacing $b_l$ with b and, respectively, take $X_{l,s}^*=\emptyset$ for $s\in[b_l+1,b)$.).

for each $i\in[m)$ do $MODSC_i \leftarrow 0$ for each $l\in[r)$ do for each $s\leftarrow b_l-1, b_l-2, \ldots, 0$ do for each $i\in[m)$ do $MODSC_i \leftarrow (2*MODSC_i)\bmod p;$ for each $x\in X_{l,s}^*$ do apply x to the a-CAM;

for each $i\in[m)$ do $MODSC_i \leftarrow (MODSC_i+ML_i)\bmod p;$ for each $i\in[m)$ do if $MODSC_i \neq 0$ then flag error in row i. (14)

Example 2: Revisiting the aCAM array from Example 1, Table 400 of FIG. 4 presents the parameters for Construction B. The values q=8, 16 have been changed into the primes p=11, 17, respectively (as alluded to above, the values of q may represent the number of programmable levels of the aCAM cells of the aCAM array—which in this case may need to be prime). For τ=1, the matrix H is again the all-one vector. For τ=2 it is a 3×53 parity-check matrix of a shortened Hamming code over $\mathbb{Z}_p$ (while selecting the lightest columns possible), and for τ=3 it is a 4×54 parity-check matrix of (a shortening of) a code (presented in Problem 3.44 in R. M. Roth, "Fault-tolerant dot-product engines," *IEEE Trans. Inf. Theory*, 65 (2019), 2046-2057), while minimizing ∥H*∥ over all possible choices for the irreducible polynomial f(•,•) therein and for the entries in the second and third rows, and adding to the fourth row all possible linear combinations of the first three rows.

If C represents a normalized alternant code over $\mathbb{Z}_p$ then (under the assumption that $\tau \leq \sqrt{n}$):

$$r = 1 + \left\lceil \frac{p-1}{p}\cdot(\tau-1)\right\rceil \cdot \lceil \log_p n \rceil \quad (15)$$

For large p, this expression is roughly (½) $\log_2 p$ smaller than the column redundancy, represented by equation (4), of Construction A. The number, r*, of rows in H* is bounded from above by:

$$r\cdot b = r\cdot \lceil \log_2 p \rceil \stackrel{(13)}{\approx} \frac{p-1}{p}\cdot \tau \cdot \log_2 n$$

So if $\|H^*\|$ is estimated to be $r \cdot b \cdot n/2$ and, respectively, $\|H\|$ is estimated to be $r \cdot n/2$ in equation (8), then the size of $X^*$ in equality (13) is twice the size of X in Construction A. It may be noted that these estimates are somewhat conservative: e.g., for $\tau=4$, the size of $X^*$ for p=17 is in fact smaller than the respective size of X for q=16 in Table 300 of FIG. 3.

Table 500 of FIG. 5 summarizes the (approximate) values of the column redundancy and of the number of error-detection input vectors for Constructions A and B (notice the different base of logarithms). The estimates for $\|H\|$ and $\|H^*\|$ for $\tau \in \{2,3\}$ are based on the assumption that half of the entries in H and H* are 1. These estimates may be somewhat be conservative.

C. External Redundancy

In the way they were presented in Sections III-A and III-B respectively, Constructions A and B use columns of the aCAM array (i.e., redundancy columns containing redundancy aCAM cells) to store computed redundancy values in each row of the aCAM array. These redundancy values are programmed as thresholds, similarly to the task-driven thresholds of the aCAM array (i.e., the redundancy values are effectively stored as analog voltage thresholds for individual redundancy aCAM cells—wherein the (redundancy) analog voltage thresholds are programmed/tuned by programming conductances of memristors in the redundancy aCAM cells).

By contrast, in external redundancy implementations, redundancy values are stored in a separate memory (e.g., a random access memory (RAM), a static RAM (SRAM), etc.) external to the aCAM array. This approach can be applied to both Constructions A and B. For simplicity, this section will describe the external redundancy implementation for Construction A (i.e., the bit-interleaving scheme), but the same/similar principles would apply for an external redundancy implementation for Construction B (i.e., the shift-and-count scheme).

Various implementations utilizing an external memory can pre-compute, into the external memory, the contribution of the redundancy values to the left-hand side of equality (7), thereby eliminating the need for the redundancy columns in the aCAM array. Such an external-redundancy scheme, however, assumes that the redundancy values are arranged in columns (similarly to the aCAM array) and that they are susceptible to errors as any aCAM cell. Yet these assumptions may not always apply. For instance, examples can arrange redundancy values in the external memory in various ways, and thus can use various error correction and error-detection techniques to protect those stored redundancy values against errors. Thus, for the purpose of error detection of an aCAM, it can be assumed that the stored redundancy values are error-free.

Doing so (with the same parity-check matrix H), examples can use the full m×n aCAM array (instead of just an m×k array) for the task-driven thresholds (i.e., those thresholds used to perform a designated computational task for the aCAM array), with each row filled (freely) with a threshold vector $v \in \mathbb{Z}_q^n$. Instead of requiring the equality (7), encoding may involve computing, for each $s \in [b \rangle$ the syndrome vector of $\phi_s$ with respect to the r×n parity-check matrix H:

$$\sigma_s = (\sigma_{l,s})_{l \in [r \rangle} = H\phi_s^T \quad (16)$$

Here, each syndrome vector $\sigma_s$ may be a $\rho$-ary r-vector, and so is each difference $$\Delta_{s,i} = (\Delta_{l,s,i})_{l \in [r \rangle} = \sigma_{s+1} - \sigma_s, s \in [b \rangle,$$

where examples define $\sigma_b = 0$ and the notation $\Delta_{s,i}$ makes explicit its dependence on the row index i in the a-CAM.

These differences, which amount to br symbols, can be stored in the external memory. The role of the detection cycle will be now to verify equality (16) (instead of equality (7)). This is achieved by changing the initialization of the modulo-p counter $\text{MODC}_i$ into:

$$\text{MODC}_i \leftarrow \Delta_{l,s,i},$$

for each $i \in [m \rangle$, as well as for each $(l,s) \in [r \rangle \times [b \rangle$.

Using an external memory for redundancy has several advantages. First, the length of the codes used by examples does not need to exceed the number of aCAM columns utilized for a computation task (i.e., all the programmed thresholds of the aCAM array can be "task-driven" thresholds). This, in turn, reduces the number of error-detection input vectors that need to be applied for detection, as there are no redundancy columns to test. Moreover, as will be shown in Example 3 below, a shorter code sometimes implies a smaller redundancy. Secondly, using an external memory allows the alphabet of the redundancy to be larger than the native alphabet of the aCAM. For example, if the native alphabet is 8 and we wish to use Construction B, then we need to take p=11. The task-driven thresholds, which are freely selected, can still be constrained to $[8 \rangle$, yet the redundancy (or syndrome) values may also take values in $[8:11 \rangle$, namely, outside the range of thresholds that can be programmed into individual cells of the aCAM. In other words, examples can apply Construction B where the number of programmable levels of an aCAM array's constituent cells is not a prime number.

When using Construction A, utilizing an external memory offers an additional advantage in allowing unequal error protection to lower versus higher significant bits. For example, lower bits might need less (or no) protection if they do not affect the result; or they may need higher protection since they are more susceptible to drifts in the values of the programmed thresholds. This flexibility can be achieved by selecting different codes $C_s$ (all of length n), with respective (binary) parity-check matrices $H_s$ and redundancies $r_s$, for different indexes $s \in [b \rangle$ of the radix-$\rho$ representation of the thresholds. Under this scenario, equality (16) becomes $$\sigma_s = H_s \phi_s^T.$$

Since the syndrome of each row $\phi_s$ in $\Phi$ is now computed with respect to a different parity-check matrix, an iteration for a given pair (l,s) in algorithm (14) cannot reuse computations made earlier for (l,s'>s). Therefore, the definition of $X_{l,s}$ in (9) can be modified as follows:

$$X_{l,s} = \{\alpha \cdot p^s \cdot e_j : \alpha \in [1 : p^{b-s} \rangle, j \in J_{l,s}\},$$

where $J_{l,s}$ is the support of row l in $H_s$. The expression (8) for |X| changes, respectively, into $$|X| = \sum_{s \in [b \rangle} (\alpha^{b-s} - 1) \cdot \|H_s\| \quad (17)$$

$$= \sum_{s \in [b \rangle} \left(\frac{q}{\alpha^s} - 1\right) \cdot \|H_s\|.$$

With varying codes, examples can reduce the overall number of redundancy/syndrome values.

Storing the (error-free) syndrome in an external memory may also allow examples to use codes C with (the same minimum distance yet with) smaller redundancy. Example 3 below can demonstrate this.

Example 3: Example 3 may involve the 512×50 aCAM array of Example 1, but with an alphabet size q=7, and may consider Construction B with τ=3. With internal redundancy, examples would need C to be a linear [n, k=50, d=4] code over $\mathbb{Z}_7$, and the shortest such code currently known has length n=55 corresponding to redundancy r=5. On the other hand, with external redundancy/syndromes, examples can have redundancy r=4 by taking H to be a 4×50 parity-check matrix of the linear [n=50, k=46, d=4] code over $\mathbb{Z}_7$.

III. Example Circuits

Figure 6:
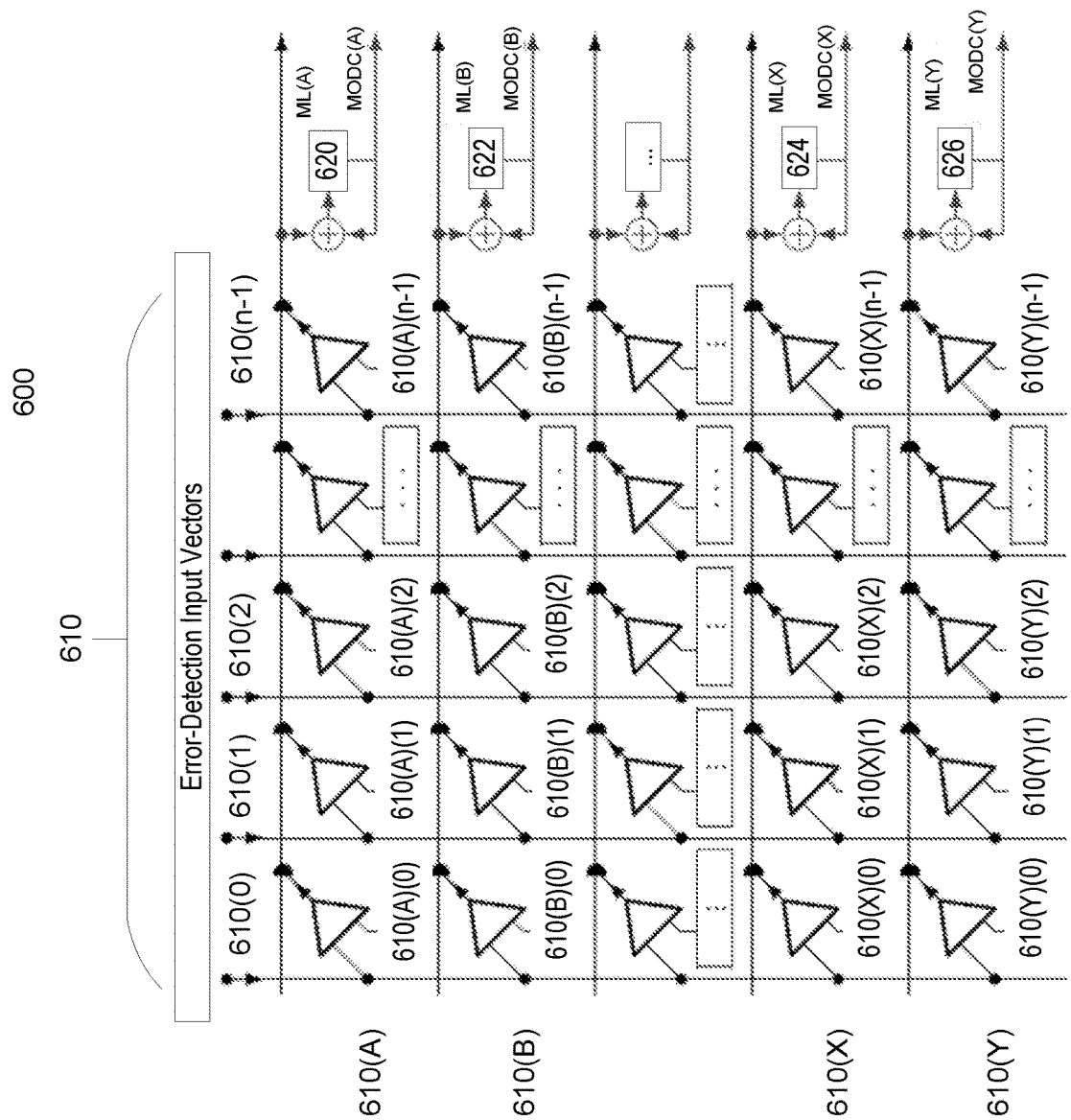
FIG. 6 depicts an example circuit, in accordance with examples of the presently disclosed technology.

FIG. 6 depicts an example circuit 600 for detecting errors in an aCAM array, in accordance with various examples of the presently disclosed technology. Circuit 600 may be an example circuit that implements an internal redundancy implementation for the bit-interleaving scheme (i.e., Construction A) described above.

As depicted, circuit 600 includes an aCAM array 610. aCAM array 610 includes multiple rows (e.g., aCAM rows 610(A), 610(B) . . . 610(X), 610(Y), etc.) and multiple columns (e.g., aCAM columns 610(0), 610(1), 610(2) . . . 610(n−1), etc.) of aCAM cells.

aCAM column 610(n−1) may be a redundancy column, and aCAM cell 610(A)(n−1) may comprise a redundancy aCAM cell of aCAM row 610(A). In various examples, aCAM array 610 may comprise additional redundancy columns. In other words, aCAM row 610(A) may include additional redundancy aCAM cells.

As alluded to above, each aCAM cell of aCAM row 610(A) (including redundancy aCAM cell 610(A)(n−1)) may be programmed to store an analog voltage threshold representing an entry of a word representationally programmed across aCAM row 610(A). As described above, each aCAM cell of aCAM row 610(A) may include a memristor. An aCAM cell of aCAM row 610(A) can be programmed to store its associated analog voltage threshold by programming conductance of its associated memristor. The number of programmable levels that an aCAM cell of aCAM array 610 is capable of storing may be proportional to a number of conductance values that its associated memristor can be reliably programmed to.

The memristor of redundancy aCAM cell 610(A)(n−1) may be programmed such that aCAM cell 610(A)(n−1)) stores a computed redundancy analog voltage threshold (i.e., an analog voltage threshold representing a computed redundancy value). As described above, the redundancy analog voltage threshold/redundancy value may be computed such that each row of a binary array representing the word (representationally programmed across aCAM row 610(A)) in binary digits includes a sequence of ones and zeros prescribed by a binary parity-check matrix (H) (i.e., a parity check matrix comprised of ones and zeroes). As described above, a parity-check matrix may refer to a matrix or similar representation that describes conditions that a codeword of a code must satisfy. Thus the sequences of ones and zeroes prescribed by the binary parity-check matrix (H)—which are imposed on aCAM row 610(A) through the programming of redundancy analog voltage thresholds in redundancy aCAM cells of aCAM row 610(A))—ensure that each row in the binary array representing the word (representationally programmed across aCAM row 610(A)) in binary digits includes at least one codeword of a code (C) relating to the binary parity-check matrix (H). In certain cases (e.g., where a maximum number of errors (i) to be detected per aCAM row equals one), this may mean that the redundancy analog voltage threshold for aCAM cell 610(A)(n−1) is computed such that each column of a given row of the binary array is an entry of a codeword (i.e., the codeword is representationally programmed across all aCAM cells of aCAM row 610(A)). However in other cases (e.g., where the maximum number of errors (i) to be detected per aCAM row is greater than one), this may mean that only a subset of columns of the given row of the binary array are entries of a codeword (i.e., the codeword is representationally programmed across a subset of the aCAM cells of aCAM row 610(A)). For example, a codeword may be representationally programmed across aCAM cells 610(A)(0), 610(A)(2), and 610(A)(n−1) (i.e., the columns of the binary array representing the analog voltage thresholds stored by aCAM cells 610(A)(0), 610(A)(2), and 610(A)(n−1) may comprise a stack of codewords).

The parity-check matrix (H) may be computed based on a number of columns of aCAM array 610 (including redundancy columns), and a maximum number of errors (i) to be detected per aCAM row. For example, where (τ=1), the parity-check matrix (H) may be an "all-one" vector of length (n) (i.e., the number of columns of aCAM array 610; it may also be the case that for τ=1 aCAM array 610 includes only one redundancy column). Thus, if the parity-check matrix (H) prescribes even parity, the redundancy analog voltage threshold for redundancy aCAM cell 610(A)(n−1) may be computed such that each row of the binary array representing the word (representationally programmed across aCAM row 610(A)) in binary digits includes an even number of ones. Relatedly, if the parity-check matrix (H) prescribes odd parity, the redundancy analog voltage threshold for redundancy aCAM cell 610(A)(n−1) may be computed such that each row of the binary array representing the word (representationally programmed across aCAM row 610(A)) in binary digits includes an odd number of ones. As a simplified example to illustrate the concept, if the "word" representationally stored across aCAM row 610(A) comprises the following sequence of thresholds/entries:

2 3 6 4 [redundancy value yet to be computed]
a binary array representing the thresholds/entries in binary digits would comprise the following:
0 0 1 1 [bit of redundancy value yet to be computed]
1 1 1 0 [bit of redundancy value yet to be computed]
0 1 0 0 [bit of redundancy value yet to be computed]

Here, if the parity-check matrix (H) prescribes even parity, each row of the binary array representing the thresholds in binary digits should include an even number of ones. Thus, the computed redundancy value for redundancy aCAM cell 610(A)(n−1) would be 3 (and the redundancy analog voltage threshold would be an analog voltage threshold representing the computed redundancy value of 3) to ensure that each row of the binary array representing the word in binary digits includes an odd number of ones, i.e.:
0 0 1 1 0
1 1 1 0 1
0 1 0 0 1

By contrast, if the parity-check matrix (H) prescribes odd parity, each row of the binary array representing the word in binary digits should include an odd number of ones. Thus, the computed redundancy value for redundancy aCAM cell 610(A)(n−1) would be 4 (and the redundancy analog voltage threshold would be an analog voltage threshold representing the computed redundancy value of 4) to ensure that each row of the binary array representing the word in binary digits includes an odd number of ones, i.e.:
0 0 1 1 1
1 1 1 0 0
0 1 0 0 0

Here it may be noted that where the binary parity-check matrix (H) is a single-row "all-one" vector, the parity condition (i.e., even or odd) applies to all columns of the binary array. However, if the binary parity-check matrix (H) is more complex (e.g., where the maximum number of errors (i) to be detected per aCAM row is greater than one) the binary parity-check matrix (H) may have multiple rows. Relatedly, (1) a first row of the binary parity-check matrix (H) may prescribe a parity condition (i.e., even or odd) for a first subset of columns of the binary array—including at least one column representing a redundancy value (in the example where (i) is greater than one there may be multiple redundancy columns, and thus multiple columns of the binary array may represent redundancy values/thresholds); (2) a second row of the binary parity-check matrix (H) may prescribe the same parity condition (i.e., even or odd) for a second subset of columns of the binary array—including at least one column representing a redundancy value; (3) a third row of the binary parity-check matrix (H) may prescribe the same parity condition (i.e., even or odd) for a third subset of columns of the binary array—including at least one column representing a redundancy value; and so on. Also, in certain examples a first row of the binary parity-check matrix (H) may prescribe a first parity condition (e.g., even parity), and a second row of the binary parity-check matrix (H) may prescribe a second (different) parity condition (e.g., odd parity). It is for these reasons that the redundancy analog voltage threshold for redundancy aCAM cell $610(A)(n-1)$) is more generally computed such that each row of the binary array representing the word (representationally programmed across aCAM row $610(A)$) in binary digits includes a sequence of ones and zeros prescribed by the binary parity-check matrix (H).

As depicted, circuit 600 also includes a counter sub-circuit associated with each aCAM row of aCAM array 610. For example, counter sub-circuit 620 is electrically connected to the match line of aCAM row $610(A)$ such that counter sub-circuit 620 receives match-related signals output from aCAM row $610(A)$. As alluded to above, the match-related signals output from aCAM row $610(A)$ may comprise a match signal when each aCAM cell of aCAM row $610(A)$ returns a match in response to an input vector being applied to circuit 600 and a mismatch signal when at least one of the aCAM cells of aCAM row $610(A)$ returns a mismatch in response to the input vector being applied to circuit 600.

As alluded to above, counter sub-circuit 620 may be a modulo-2 counter sub-circuit that stores either a first value or a second value (e.g., a 0 or a 1). The value stored by counter sub-circuit 620 may switch in response to counter sub-circuit 620 receiving a match signal and may remain the same in response to counter sub-circuit 620 receiving a mismatch signal.

As alluded to above, in response to a first set of error detection input vectors being sequentially applied to circuit 600, circuit 600 can detect an error in aCAM row $610(A)$ when: (a) if the binary parity matrix (H) prescribes even parity, the value stored by counter sub-circuit 620 after sequential application of the first set of error detection input vectors is different than the value stored by counter sub-circuit 620 before sequential application of the first set of error detection input vectors (as alluded to above, this may correspond to counter sub-circuit 620 receiving an even number of match signals); and (b) if the binary parity matrix (H) prescribes odd parity, the value stored by counter sub-circuit 620 after sequential application of the first set of error detection input vectors is the same as the value stored by counter sub-circuit 620 before sequential application of the first set of error detection input vectors (as alluded to above, this may correspond to counter sub-circuit 620 receiving an odd number of match signals).

Like the redundancy values described above, the first set of error-detection input vectors may be computed based on the parity-check matrix (H). When applied to aCAM array 610, each error detection input vector may comprise a plurality of analog voltage input signals, each analog voltage input signal being applied down one of the columns of aCAM array 610 (when initially received by circuit 600 an error-detection input vector may comprise a digital input signal/plurality of digital input signals which are converted by circuit 600—using e.g., digital-to-analog converting circuit components—into the plurality of analog voltage signals before application down the columns of aCAM array 610). When applied to aCAM array 610, each error detection input vector may only include one "non-wildcard" analog voltage input signal, where a "wildcard" analog voltage input signal is computed such that any aCAM cell of aCAM array 610 always returns a match when the wildcard analog voltage input signal is applied to it (by this construction, each error-detection vector effectively checks one column of aCAM array 610). In part through their relation to the parity-check matrix (H)—which itself is computed based on the number of columns of aCAM array 610 and a maximum number of errors (i) to be detected across a single aCAM row—the first set of error-detection input vectors may be computed based on: (a) a number of columns of aCAM array 610, wherein a number of error detection vectors in the first set of error detection vectors is an integer multiple of the number of columns in the aCAM array; (b) a number of programmable levels that each aCAM cell of aCAM array 610 can be programmed to store; and (c) a maximum number of errors (i) to be detected across a single aCAM row.

As alluded to above, in certain examples detecting errors in aCAM array 610 may comprise applying multiple sets of error-detection input vectors to circuit 600—where an error in a given aCAM row of aCAM array 610 is detected after application of the final error-detection input vector of a set. For example, after application of the final error-detection input vector of first the set of error-detection input vectors circuit 600 may detect an error in aCAM row $610(A)$; after application of the final error-detection input vector of a second set of error-detection input vectors circuit 600 may detect an error in aCAM row $610(C)$; after application of the final error-detection input vector of a third set of error-detection input vectors circuit 600 may detect an error in aCAM row $610(B)$; and so on. Here, each set of error-detection input vectors may be computed in the same/similar manner using the binary parity-check matrix (H).

Figure 7:
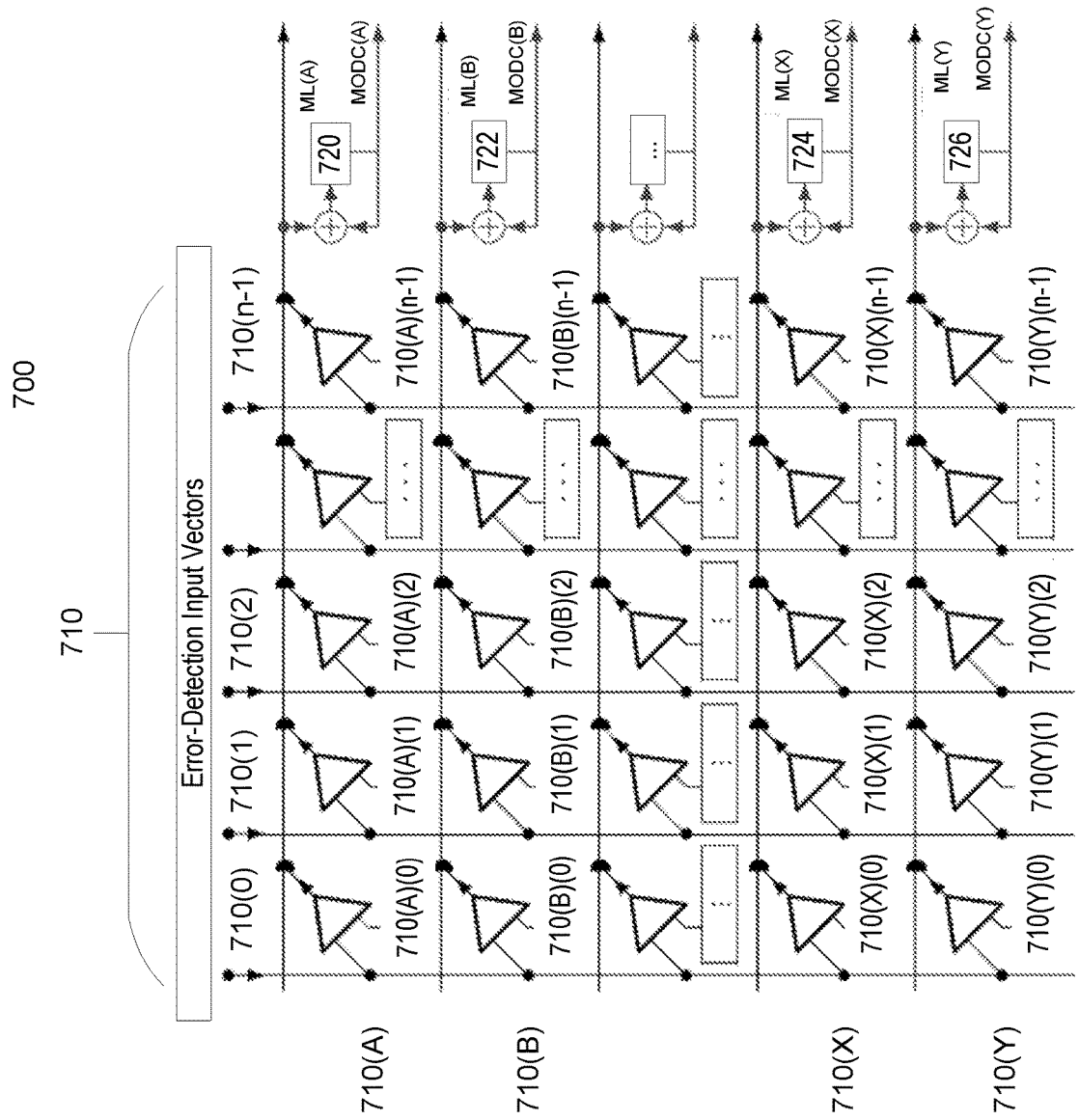
FIG. 7 depicts an example circuit, in accordance with examples of the presently disclosed technology.

FIG. 7 depicts an example circuit 700 for detecting errors in an aCAM array, in accordance with various examples of the presently disclosed technology. Circuit 700 may be an example circuit that implements an external redundancy implementation for the bit-interleaving scheme (i.e., Construction A) described above.

As depicted, circuit 700 includes an aCAM array 710. aCAM array 710 includes multiple rows (e.g., aCAM rows $710(A)$, $710(B)$ . . . $710(X)$, $710(Y)$, etc.) and multiple columns (e.g., aCAM columns $710(0)$, $710(1)$, $710(2)$ . . . $710(n-1)$, etc.) of aCAM cells.

Unlike aCAM array 610 of FIG. 6, aCAM array 710 may not include redundancy columns/redundancy aCAM cells. Accordingly, each column/aCAM cell of aCAM array 710 may be programmed for/devoted to a computational task. In other words, all the programmed thresholds of aCAM array 710 may be "task-driven" thresholds.

Similar to the aCAM cells of aCAM row 610(A) described in conjunction with FIG. 6, each aCAM cell of aCAM row 710(A) may be programmed to store an analog voltage threshold representing an entry of a word representationally programmed across aCAM row 710(A). Each aCAM cell of aCAM row 710(A) may include a memristor. An aCAM cell of aCAM row 710(A) can be programmed to store its analog voltage threshold by programming conductance of its memristor. The number of programmable levels that an aCAM cell of aCAM array 710 is capable of storing may be proportional to a number of conductance values that its memristor can be reliably programmed to.

As alluded to above, in external redundancy implementations computed redundancy values are stored in a memory (e.g., a RAM) external to an aCAM array. Accordingly, redundancy values for circuit 700 may be stored in a memory (not pictured) external to aCAM array 710. In certain examples this memory may be a part of circuit 700, but in other examples the memory may be external to circuit 700. Here, the redundancy values stored in the (external) memory may be computed in the same/similar manner as described in conjunction with FIG. 6 and Sections I-III.

Like circuit 600, circuit 700 includes a counter sub-circuit associated with each aCAM row of aCAM array 710. For example, counter sub-circuit 720 is electrically connected to the match line of aCAM row 710(A) such that counter sub-circuit 720 receives match-related signals output from aCAM row 710(A). As alluded to above, the match-related signals output from aCAM row 710(A) may comprise a match signal when each aCAM cell of aCAM row 710(A) returns a match in response to an input vector being applied to circuit 700 and a mismatch signal when at least one of the aCAM cells of aCAM row 710(A) returns a mismatch in response to the input vector being applied to circuit 700.

As alluded to above, counter sub-circuit 720 may be a modulo-2 counter sub-circuit that stores a value of either one or zero. The value stored by counter sub-circuit 720 may switch in response to counter sub-circuit 720 receiving a match signal and may remain the same in response to counter sub-circuit 720 receiving a mismatch signal.

As described in conjunction with Section II-C, in the external redundancy implementation redundancy values stored in external memory may be imposed on circuit 700 through strategic initializing (and in certain cases re-initializing) of the values stored by the counter sub-circuits of circuit 700.

For example, prior to a first set of error detection input vectors being sequentially applied to circuit 700 (this first set of error detection input vectors may be computed in the same/similar manner as described in conjunction with FIG. 6 and Sections I-II), the value stored by counter sub-circuit 720 may be initialized in accordance with at least one computed syndrome vector ($\sigma$) for a binary array representing the word (representationally programmed across aCAM row 710(A)) in binary digits. In certain of these examples (and as alluded to above), this value may be set to the value of a bit of a stored syndrome comparison vector ($\Delta$), the stored syndrome comparison vector ($\Delta$) computed by performing an exclusive "OR" operation between two computed syndrome vectors (e.g., $\sigma_s$ and $\sigma_{s-1}$) for the binary array, the two computed syndrome vectors associated with adjacent rows of the binary array. As alluded to above, the at least one computed syndrome vector ($\sigma$) may be computed based on the binary array and a binary parity-check matrix (H).

As alluded to above, in response to the first set of error detection input vectors being sequentially applied to circuit 700, circuit 700 detects an error in aCAM row 710(A): (a) if the binary parity-check matrix (H) prescribes a first type of parity (e.g., even or odd), the value stored by counter sub-circuit 720 after sequential application of the first set of error detection input vectors is zero, and (b) if the binary parity-check matrix prescribes a second type of parity (e.g., the other of even or odd), the value stored by counter sub-circuit 720 after sequential application of the first set of error detection input vectors is one.

Figure 8:
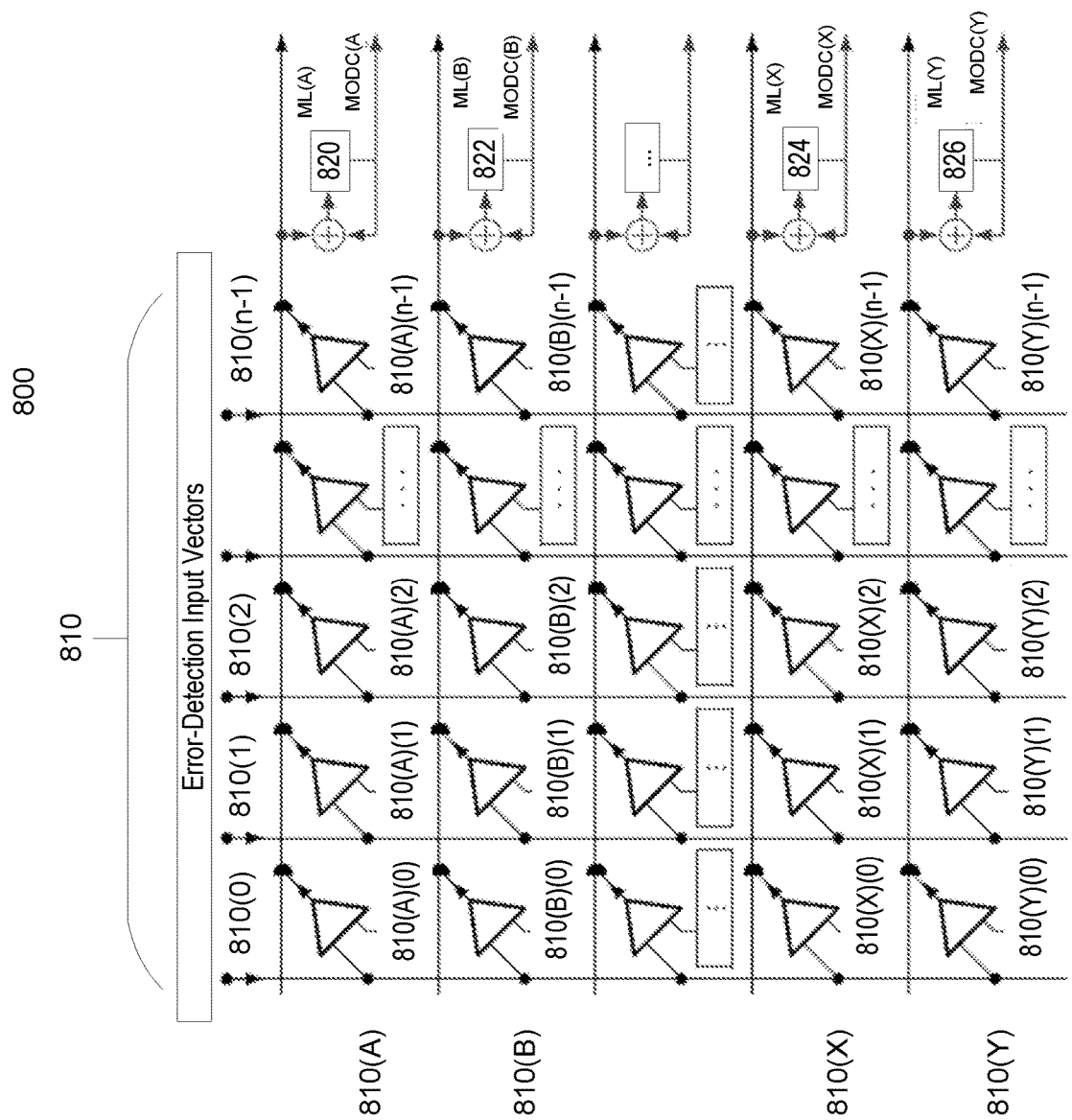
FIG. 8 depicts an example circuit, in accordance with examples of the presently disclosed technology.

FIG. 8 depicts an example circuit 800 for detecting errors in an aCAM array, in accordance with various examples of the presently disclosed technology. Circuit 800 may be an example circuit that implements the shift-and-count scheme (i.e., Construction B) described above.

As depicted, circuit 800 includes an aCAM array 810. aCAM array 810 includes multiple rows (e.g., aCAM rows 810(A), 810(B) . . . 810(X), 810(Y), etc.) and multiple columns (e.g., aCAM columns 810(0), 810(1), 810(2) . . . 810(n−1), etc.) of aCAM cells.

Similar to the aCAM cells of aCAM rows 610(A) and 710(A) described in conjunction with FIGS. 6 and 7 respectively, each aCAM cell of aCAM row 810(A) may be programmed to store an analog voltage threshold representing an entry of a word representationally programmed across aCAM row 810(A). Each aCAM cell of aCAM row 810(A) may include a memristor. An aCAM cell of aCAM row 810(A) can be programmed to store its analog voltage threshold by programming conductance of its memristor. The number of programmable levels that an aCAM cell of aCAM array 810 is capable of storing may be proportional to a number of conductance values that its memristor can be reliably programmed to.

In examples where circuit 800 implements an internal redundancy implementation, one or more of the columns of aCAM array 810 may comprise redundancy columns. In other words, one or more of the aCAM cells of aCAM row 810(A) may comprise redundancy aCAM cells. As described above, a redundancy aCAM cell may be programmed to store a computed redundancy analog voltage threshold. As described above, the redundancy analog voltage threshold (or more specifically a redundancy value represented by the redundancy analog voltage threshold) may be computed using a parity-check matrix (H) such that the word includes at least one codeword of a code (C) relating to the parity-check matrix (H) (as described above, the codewords of the code (C) may be over an alphabet size w). Accordingly, circuit 800 is different than certain implementations of circuits 600 and 700 (i.e., the circuits implementing Construction A) where each row of a binary array representing the word (representationally stored across an aCAM row) includes at least one codeword.

In other examples circuit 800 may implement an external redundancy implementation and all of the aCAM cells of aCAM array 810 may be programmed as task-driven thresholds (i.e., thresholds/aCAM cells devoted to a designated computational task).

Like circuits 600 and 700, circuit 800 includes a counter sub-circuit associated with each aCAM row of aCAM array 810. However, instead of utilizing modulo-2 counter sub-circuits, the counter sub-circuits of circuit 800 may be modulo-q counter sub-circuits capable of multiplying by 2 modulo q. In particular, unlike the modulo-2 counter sub-circuits of FIGS. 6-7, the modulo-q counter sub-circuits may be able to store "q" unique values. Multiplication by 2, in turn, is carried out by a shift operation of the bits in the modulo-q counter sub-circuits (to be described in more detail in the following paragraph). This is why the modulo-q counter sub-circuits are denoted "MODSC", and may be referred to as "modulo-q shift-counter sub-circuits" or "modulo-q shift+counter sub-circuits".

A modulo-q counter sub-circuit may comprise one input data bit, one input control bit, one output bit, and a cascade of b single-bit memories whose contents are seen as the binary representation of an integer between 0 and $2^{b-1}$. The number b may be selected to be the smallest number allowable to represent the q levels 0, 1, ..., q–1. The input control bit can determine whether the modulo-q counter sub-circuit is either in a "count mode" or in a "shift mode." Under "count mode," during each clock cycle, the input data bit is added (using a standard adder circuit) to the integer that is represented in the b memory bits. If the result is q, then the contents of all the memory bits are reset. Otherwise, the result is written into the memory bits. Under "shift mode," the content of each memory bit is shifted to the next (higher-significant) bit in the cascade, with the most-significant bit becoming a "carry bit" and with 0 inserted into the least-significant bit. If the resulting contents of the b+1 bits (=b memory bits and the carry bit) represent a number that is at least q, then q is subtracted (using a standard subtraction circuit) from the number that is represented by those b+1 bits. The output bit is the inclusive-OR of all the b memory bits.

As alluded to above, q may correspond to the number of programmable levels for the aCAM cells of aCAM array 810. The number of programmable levels, q, that an aCAM cell of aCAM array 810 is capable of storing may be proportional to a number of conductance values that its memristor can be reliably programmed to. Here, the value of q may be the alphabet size of the code (C) as well.

As depicted, counter sub-circuit 820 is electrically connected to the match line of aCAM row 810(A) such that counter sub-circuit 820 receives match-related signals output from aCAM row 810(A). The match-related signals output from aCAM row 810(A) may comprise a match signal when each aCAM cell of aCAM row 810(A) returns a match in response to an input vector being applied to circuit 800 and a mismatch signal when at least one of the aCAM cells of aCAM row 810(A) returns a mismatch in response to the input vector being applied to circuit 800).

Here, the value stored by counter sub-circuit 820 may change in response to counter sub-circuit 820 receiving a match signal and remain the same in response to counter sub-circuit 820 receiving a mismatch signal.

Circuit 800 may detect an error when the value stored by counter sub-circuit 820 after sequential application of the a set of error detection input vectors is non-zero. In other words, the value stored by counter sub-circuit 820 after sequential application of the a set of error detection input vectors is non-zero is zero if an only if all the b bits are zero, so a zero output bit is equivalent to having the b memory bits representing the integer 0.

Figure 9:
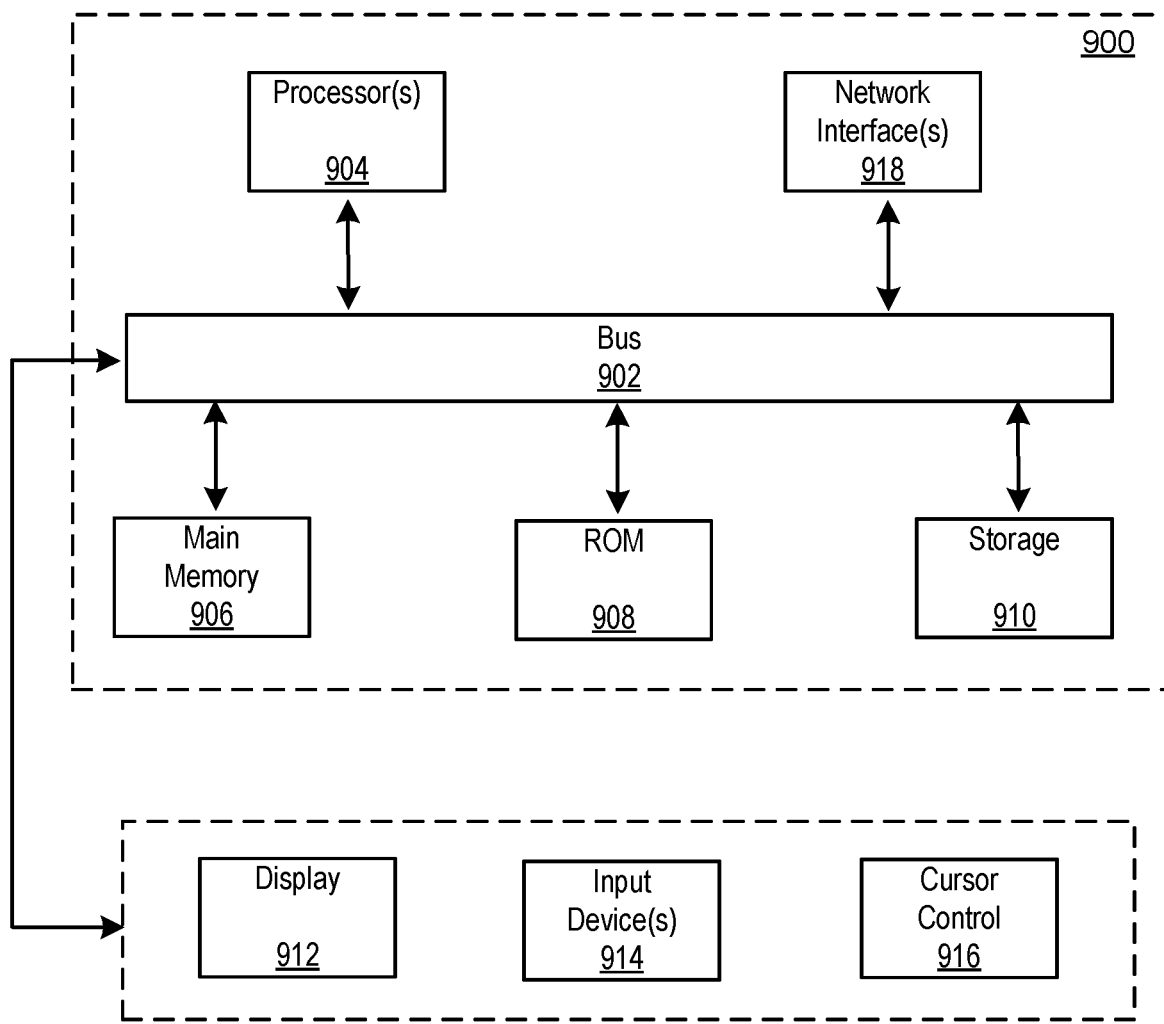
FIG. 9 depicts a block diagram of an example computer system in which various of the examples described herein may be implemented.

FIG. 9 depicts a block diagram of an example computer system 1100 in which various of the examples described herein may be implemented. For example, computer system 900 may be used to program threshold values for circuits 600, 700, and 800. Computer system 900 may also be used to compute redundancy values and error-detection input vectors. Computer system 900 may also be used to initialize and re-initialize values stored by counter sub-circuits.

The computer system 900 includes a bus 912 or other communication mechanism for communicating information, one or more hardware processors 904 coupled with bus 912 for processing information. Hardware processor(s) 904 may be, for example, one or more general purpose microprocessors.

The computer system 900 also includes a main memory 906, such as a random access memory (RAM), cache and/or other dynamic storage devices, coupled to bus 912 for storing information and instructions to be executed by processor 904. Main memory 906 also may be used for storing temporary variables or other intermediate information during execution of instructions to be executed by processor 904. Such instructions, when stored in storage media accessible to processor 904, render computer system 900 into a special-purpose machine that is customized to perform the operations specified in the instructions.

The computer system 900 further includes a read only memory (ROM) 908 or other static storage device coupled to bus 912 for storing static information and instructions for processor 904. A storage device 910, such as a magnetic disk, optical disk, or USB thumb drive (Flash drive), etc., is provided and coupled to bus 912 for storing information and instructions.

The computer system 900 may be coupled via bus 912 to a display 912, such as a liquid crystal display (LCD) (or touch screen), for displaying information to a computer user. An input device 914, including alphanumeric and other keys, is coupled to bus 912 for communicating information and command selections to processor 904. Another type of user input device is cursor control 916, such as a mouse, a trackball, or cursor direction keys for communicating direction information and command selections to processor 904 and for controlling cursor movement on display 912. In some embodiments, the same direction information and command selections as cursor control may be implemented via receiving touches on a touch screen without a cursor.

The computing system 900 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor(s) 904 executing one or more sequences of one or more instructions contained in main memory 906. Such instructions may be read into main memory 906 from another storage medium, such as storage device 910. Execution of the sequences of instructions contained in main memory 906 causes processor(s) 904 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 190. Volatile media includes dynamic memory, such as main memory 906. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 912. Transmission media can also take the form of acoustic or light waves, such as those generated during radio-wave and infra-red data communications.

The computer system 900 also includes a communication interface 918 coupled to bus 912. Network interface 918 provides a two-way data communication coupling to one or more network links that are connected to one or more local networks. For example, communication interface 918 may be an integrated services digital network (ISDN) card, cable modem, satellite modem, or a modem to provide a data communication connection to a corresponding type of telephone line. As another example, network interface 918 may be a local area network (LAN) card to provide a data communication connection to a compatible LAN (or WAN component to communicated with a WAN). Wireless links may also be implemented. In any such implementation, network interface 918 sends and receives electrical, electromagnetic or optical indicators that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical indicators that carry digital data streams. The indicators through the various networks and the indicators on network link and through communication interface 918, which carry the digital data to and from computer system 900, are example forms of transmission media.

The computer system 900 can send messages and receive data, including program code, through the network(s), network link and communication interface 918. In the Internet example, a server might transmit a requested code for an application program through the Internet, the ISP, the local network and the communication interface 918.

The received code may be executed by processor 904 as it is received, and/or stored in storage device 910, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 900.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit comprising:
   an analog content addressable memory (aCAM) array comprising a row of aCAM cells electrically connected along a match line, each aCAM cell of the row of aCAM cells programmed to store an analog voltage threshold representing an entry of a word representationally programmed across the row of aCAM cells, wherein:
   the row of aCAM cells includes a redundancy aCAM cell programmed to store a computed redundancy analog voltage threshold, and
   the redundancy analog voltage threshold is computed such that each row of a binary array representing the word in binary digits includes a sequence of ones and zeros prescribed by a binary parity check matrix.

2. The circuit of claim 1, further comprising:
   a counter sub-circuit electrically connected to the match line such that the counter sub-circuit receives match-related signals output from the row of aCAM cells, the match-related signals output from the row of aCAM cells comprising a match signal when each aCAM cell of the row of aCAM cells returns a match in response to an input vector being applied to circuit and a mismatch signal when at least one of the aCAM cells of the row of aCAM cells returns a mismatch in response to the input vector being applied to the circuit.

3. The circuit of claim 2, wherein:
   the counter sub-circuit stores either a first value or a second value;
   the value stored by the counter sub-circuit switches in response to the counter sub-circuit receiving a match signal and remains the same in response to the counter sub-circuit receiving a mismatch signal; and
   in response to a set of error detection input vectors being sequentially applied to the circuit, the circuit detects an error in the row of aCAM cells when:
      if the binary parity matrix (H) prescribes even parity, the value stored by the counter sub-circuit after sequential application of the set of error detection input vectors is different than the value of the counter sub-circuit before sequential application of the set of error detection input vectors, and
      if the binary parity matrix (H) prescribes odd parity, the value stored by the counter sub-circuit after sequential application of the set of error detection input vectors is the same as the value of the counter sub-circuit before sequential application of the set of error detection input vectors.

4. The circuit of claim 3, wherein, when applied to the row of aCAM cells, each error detection input vector comprises a plurality of analog voltage input signals, each analog voltage input signal of the plurality of analog voltage signal being applied to one of the aCAM cells of the row of aCAM cells.

5. The circuit of claim 4, wherein, when applied to the row of aCAM cells, each error detection input vector only includes one non-wildcard analog voltage input signal, a wildcard analog voltage input signal computed such that any aCAM cell of the aCAM array always returns a match when the wildcard analog voltage input signal is applied to it.

6. The circuit of claim 5, wherein the set of error detection input vectors are computed based on:
   a number of aCAM cells in the row of aCAM cells, wherein a number of error detection vectors in the set of error detection vectors is an integer multiple of the number of aCAM cells in the row of aCAM cells;
   a number of programmable levels that each aCAM cell of the row of aCAM cells is capable of storing; and
   a maximum number of errors to be detected across the row of aCAM cells.

7. The circuit of claim 6, wherein:
   each row of the binary array representing the representationally programmed word in binary digits includes a codeword of a code;
   the binary parity-check matrix relates to the code and the code is selected based on the number of aCAM cells in the row of aCAM cells and the maximum number of errors to be detected; and
   the set of error detection input vectors are computed using rows of the binary parity-check matrix.

8. The circuit of claim 7, wherein the set of error detection input vectors is a first set of multiple sets of error detection input vectors computed for detecting errors stored by the aCAM array.

9. The circuit of claim 5, wherein:
   each aCAM cell of the row of aCAM cells includes a memristor; and
   an aCAM cell of the row of aCAM cells is programmed to store its analog voltage threshold by programming conductance of its memristor.

10. The circuit of claim 9, wherein:
    the number of programmable levels that an aCAM cell of the row of aCAM cells is capable of storing is proportional to a number of conductance values that its memristor can be reliably programmed to.

11. A circuit comprising:
    an analog content addressable memory (aCAM) array comprising a row of aCAM cells electrically connected along a match line, each aCAM cell of the row of aCAM cells programmed to store an analog voltage threshold representing an entry of a word representationally programmed across the row of aCAM cells; and
    a counter sub-circuit electrically connected to the match line such that the counter sub-circuit receives match-related signals output from the row of aCAM cells, the match-related signals output from the row of aCAM cells comprising a match signal when each aCAM cell of the row of aCAM cells returns a match in response to an input vector being applied to circuit and a mismatch signal when at least one of the aCAM cells of the row of aCAM cells returns a mismatch in response to the input vector being applied to the circuit, wherein:

the counter sub-circuit stores either a value of zero or one;

the value stored by the counter sub-circuit switches in response to the counter sub-circuit receiving a match signal and remains the same in response to the counter sub-circuit receiving a mismatch signal.

12. The circuit of claim 11, wherein:

prior to a set of error detection input vectors being sequentially applied to the circuit, the value stored by the counter sub-circuit is initialized in accordance with at least one computed syndrome vector for a binary array representing the word in binary digits.

13. The circuit of claim 12, wherein:

the value stored by the counter sub-circuit initialized in accordance with the at least one computed syndrome vector is set to the value of a bit of a stored syndrome comparison vector, the stored syndrome comparison vector computed by performing an exclusive "OR" operation between two computed syndrome vectors for the binary array, the two computed syndrome vectors associated with adjacent rows of the binary array.

14. The circuit of claim 12, wherein:

the at least one computed syndrome vector is computed based on the binary array and a binary parity-check matrix.

15. The circuit of claim 14, wherein:

in response to the set of error detection input vectors being sequentially applied to the circuit, the circuit detects an error in the row of aCAM cells when:

if the binary parity-check matrix prescribes a first type of parity, the value stored by the counter sub-circuit after sequential application of the set of error detection input vectors is zero, and if the binary parity-check matrix prescribes a second type of parity, the value stored by the counter sub-circuit after sequential application of the set of error detection input vectors is one.

16. The circuit of claim 11, wherein:

each aCAM cell of the row of aCAM cells includes a memristor; and an aCAM cell of the row of aCAM cells is programmed to store its analog voltage threshold by programming conductance of its memristor.

17. A circuit comprising:

an analog content addressable memory (aCAM) array comprising a row of aCAM cells electrically connected along a match line, each aCAM cell of the row of aCAM cells programmed to store an analog voltage threshold representing an entry of a word representationally programmed across the row of aCAM cells; and a modulo-q counter sub-circuit electrically connected to the match line such that the modulo-q counter sub-circuit receives match-related signals output from the row of aCAM cells, the match-related signals output from the row of aCAM cells comprising a match signal when each aCAM cell of the row of aCAM cells returns a match in response to an input vector being applied to circuit and a mismatch signal when at least one of the aCAM cells of the row of aCAM cells returns a mismatch in response to the input vector being applied to the circuit, wherein:

q is a number of programmable levels of a given aCAM cell of the row of aCAM cells and is also a prime number, and the value stored by the modulo-q counter sub-circuit changes in response to the counter sub-circuit receiving a match signal and remains the same in response to the counter sub-circuit receiving a mismatch signal.

18. The circuit of claim 17, wherein:

the row of aCAM cells includes a redundancy aCAM cell programmed to store a computed redundancy analog voltage threshold;

the redundancy analog voltage threshold is computed using a parity-check matrix such that the word includes at least one codeword of a code relating to the parity-check matrix; and the code has an alphabet size of q.

19. The circuit of claim 18, wherein:

each aCAM cell of the row of aCAM cells includes a memristor; and an aCAM cell of the row of aCAM cells is programmed to store its analog voltage threshold by programming conductance of its memristor.

20. The circuit of claim 19, wherein:

the number of programmable levels, q, that an aCAM cell of the row of aCAM cells is capable of storing is proportional to a number of conductance values that its memristor can be reliably programmed to.

* * * * *